US012166000B2

(12) United States Patent
Na et al.

(10) Patent No.: US 12,166,000 B2
(45) Date of Patent: Dec. 10, 2024

(54) SEMICONDUCTOR DEVICE INCLUDING A LOWER CHIP INCLUDING A PERIPHERAL CIRCUIT AND FIRST AND SECOND MEMORY CHIPS VERTICALLY STACKED THEREON AND DATA STORAGE SYSTEM INCLUDING THE SAME

(71) Applicant: Samsung Electronics Co., Ltd., Suwon-si (KR)

(72) Inventors: Hoonjoo Na, Seoul (KR); Jungseob So, Seoul (KR); Taeseong Kim, Suwon-si (KR); Sohye Cho, Hwaseong-si (KR); Sonkwan Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 426 days.

(21) Appl. No.: 17/541,719

(22) Filed: Dec. 3, 2021

(65) Prior Publication Data

US 2022/0310541 A1    Sep. 29, 2022

(30) Foreign Application Priority Data

Mar. 24, 2021  (KR) ........................ 10-2021-0038070

(51) Int. Cl.
*H01L 25/065* (2023.01)
*H01L 23/00* (2006.01)
*H01L 25/18* (2023.01)

(52) U.S. Cl.
CPC .......... *H01L 24/08* (2013.01); *H01L 25/0657* (2013.01); *H01L 25/18* (2013.01);
(Continued)

(58) Field of Classification Search
CPC ..... H01L 24/08; H01L 25/0657; H01L 25/18; H01L 2224/08145; H01L 2924/1431; H01L 2924/14511; H10B 43/27
See application file for complete search history.

(56) References Cited

U.S. PATENT DOCUMENTS 9,202,570 B2    12/2015  Hwang et al.
10,651,153 B2    5/2020  Fastow et al.
(Continued)

FOREIGN PATENT DOCUMENTS

CN    111033739 A    4/2020

*Primary Examiner* — Thanh Y. Tran
(74) *Attorney, Agent, or Firm* — Harness, Dickey & Pierce, P.L.C.

(57) ABSTRACT

The semiconductor device includes a lower chip structure including a peripheral circuit, a first memory chip structure on the lower chip structure, and a second memory chip structure on the first memory chip structure. The first memory chip structure includes a first stack structure and a first vertical memory structure. The first stack structure includes first gate lines stacked in a vertical direction and extending in a first horizontal direction. The first vertical memory structure penetrates through the first gate lines in the vertical direction. The second memory chip structure includes a second stack structure and a second vertical memory structure. The second stack structure includes second gate lines stacked in the vertical direction and extending in a second horizontal direction, perpendicular to the first horizontal direction. The second vertical memory structure penetrates through the second gate lines in the vertical direction.

20 Claims, 14 Drawing Sheets

(52) U.S. Cl.
CPC .............. *H01L 2224/08145* (2013.01); *H01L 2924/1431* (2013.01); *H01L 2924/14511* (2013.01)

(56) References Cited

U.S. PATENT DOCUMENTS

| | | | |
|---|---|---|---|
| 10,651,187 | B2 | 5/2020 | Liu |
| 11,322,483 | B1 * | 5/2022 | Ogawa .................... H01L 24/80 |
| 2016/0079164 | A1 | 3/2016 | Fukuzumi et al. |
| 2019/0088589 | A1 | 3/2019 | Zhu et al. |
| 2020/0144242 | A1 | 5/2020 | Park |
| 2020/0176443 | A1 | 6/2020 | Xiao et al. |
| 2020/0194403 | A1 | 6/2020 | Xiao |
| 2020/0203328 | A1 | 6/2020 | Park et al. |
| 2020/0203329 | A1 | 6/2020 | Kanamori et al. |
| 2021/0134778 | A1 | 5/2021 | Huang et al. |

\* cited by examiner

SEMICONDUCTOR DEVICE INCLUDING A LOWER CHIP INCLUDING A PERIPHERAL CIRCUIT AND FIRST AND SECOND MEMORY CHIPS VERTICALLY STACKED THEREON AND DATA STORAGE SYSTEM INCLUDING THE SAME

CROSS-REFERENCE TO RELATED APPLICATION(S)

This application claims benefit of priority to Korean Patent Application No. 10-2021-0038070 filed on Mar. 24, 2021 in the Korean Intellectual Property Office, the disclosure of which is incorporated herein by reference in its entirety.

BACKGROUND

The present disclosure relates to semiconductor devices and/or data storage systems including the same.

There has been a demand for a semiconductor device for storing high-capacity data in an electronic system requiring data storage. Accordingly, there have been studies into measures for increasing the data storage capacity of a semiconductor device. For example, as one method for increasing data storage capacity of a semiconductor device, a semiconductor device including memory cells arranged three-dimensionally, rather than memory cells arranged two-dimensionally, has been suggested.

SUMMARY

Some example embodiments provide semiconductor devices for improving integration density and reliability.

According to an example embodiment, a semiconductor device may include a lower chip structure including a peripheral circuit, a first memory chip structure on the lower chip structure, and a second memory chip structure on the first memory chip structure. The first memory chip structure may include a first stack structure, including first gate lines stacked in a vertical direction and extending in a first horizontal direction perpendicular to the vertical direction, and a first vertical memory structure penetrating through the first gate lines of the first stack structure in the vertical direction. The second memory chip structure may include a second stack structure, including second gate lines stacked in the vertical direction and extending in a second horizontal direction perpendicular to the first horizontal direction, and a second vertical memory structure penetrating through the second gate lines of the second stack structure in the vertical direction.

According to an example embodiment, a semiconductor device may include a first memory chip structure including first word lines spaced apart from each other and stacked in a vertical direction and extending in a first horizontal direction perpendicular to the vertical direction and a first vertical memory structure penetrating through the first word lines in the vertical direction, and a second memory chip structure including second word lines spaced apart from each other and stacked in the vertical direction and extending in a second horizontal direction that is perpendicular to the vertical direction and the first horizontal direction and second vertical memory structures penetrating through the second word lines in the vertical direction. The second memory chip structure may be in contact with the first memory chip structure.

According to an example embodiment, a data storage system may include a main substrate, a semiconductor device on the main substrate, and a controller electrically connected to the semiconductor device on the main substrate. The semiconductor device may include a first memory chip structure comprising first word lines spaced apart from each other and stacked in a vertical direction and extending in a first horizontal direction perpendicular to the vertical direction and a first vertical memory structure penetrating through the first word lines in the vertical direction, and a second memory chip structure comprising second word lines spaced apart from each other and stacked in the vertical direction and extending in a second horizontal direction perpendicular to the vertical direction and the first horizontal direction, and second vertical memory structures penetrating through the second word lines in the vertical direction. The second memory chip structure may be in contact with the first memory chip structure.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, some example embodiments will be described with reference to the accompanying drawings.

In the descriptions below, terms "upper," "upper portion," "upper surface," "lower," "lower portion," "lower surface," "side surface," and the like, are used with reference to the diagrams unless otherwise indicated.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
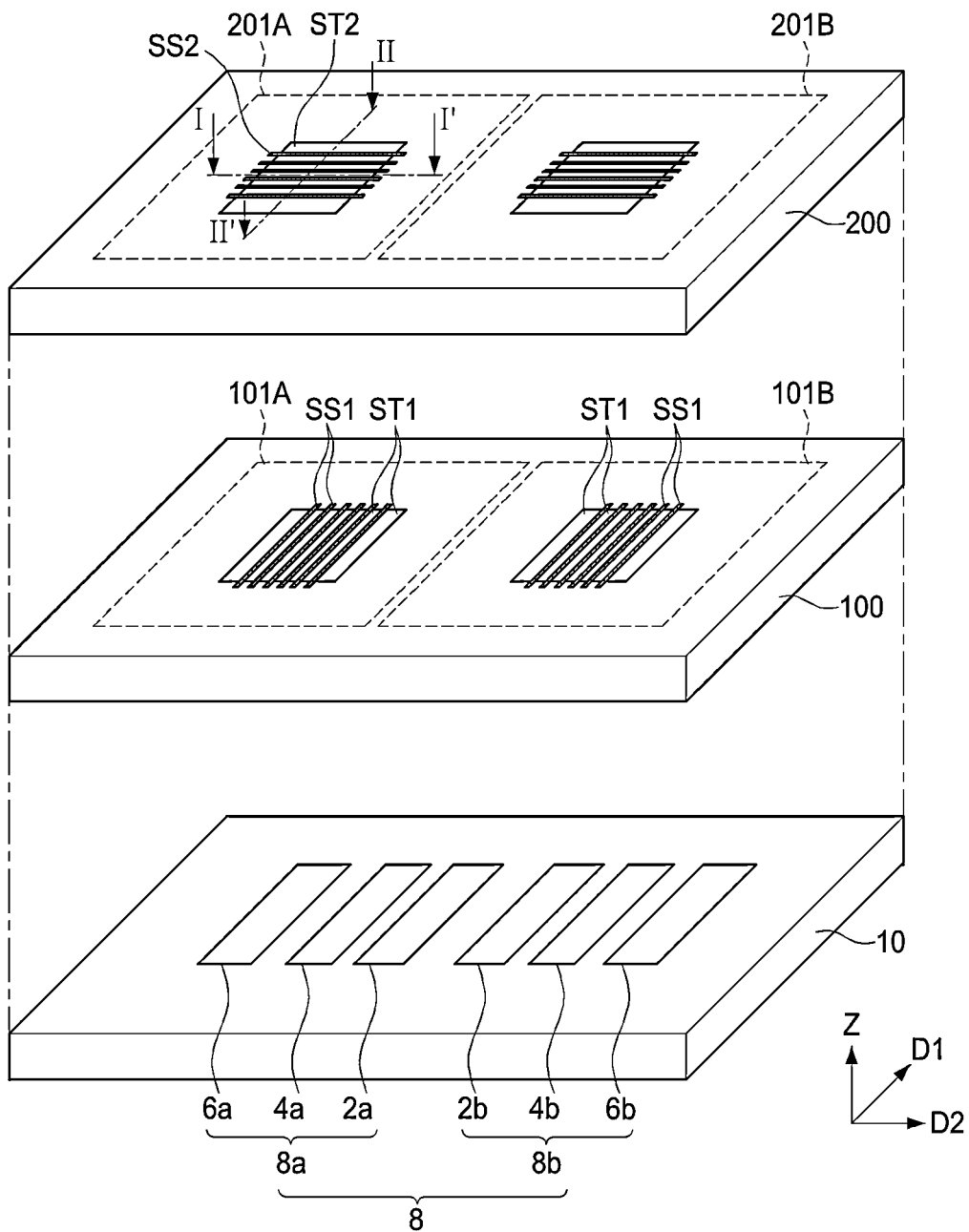
FIG. 1 is a schematic perspective view of a semiconductor device according to an example embodiment.

A semiconductor device according to an example embodiment will be described with reference to FIG. 1. FIG. 1 is a schematic perspective view of a semiconductor device according to an example embodiment.

Referring to FIG. 1, a semiconductor device 1 according to an example embodiment may include a first memory chip structure 100 and a second memory chip structure 200 on the first memory chip structure 100. The second memory chip structure 200 may be bonded to the first memory chip structure 100 in a vertical direction Z.

The first memory chip structure 100 may include a first region 101A and a second region 101B. The first and second regions 101A and 101B may be symmetrical to each other with respect to a center of the first memory chip structure. Each of the first and second regions 101A and 101B may include a first stack structure ST1 and a first separation structure SS1 intersecting and penetrating through the first stack structure ST1. Each of the first separation structures SS1 may extend in a first horizontal direction D1, perpendicular to the vertical direction Z. Each of the first and second regions 101A and 101B may include a memory cell structure including a plurality of memory cells arranged three-dimensionally.

While only two first and second regions 101A and 101B are illustrated in FIG. 1, example embodiments are not limited thereto and the number thereof may be three or more.

The second memory chip structure 200 may include a third region 201A and a fourth region 201B. The third and fourth regions 201A and 201B may be symmetrical to each other with respect to a center of the first memory chip structure. Each of the third and fourth regions 201A and 201B may include a second stack structure ST2 and a second separation structure SS2 intersecting and penetrating through the second stack structure ST2. Each of the second separation structures SS2 may extend in a second horizontal direction D2, which is perpendicular to the vertical direction Z and the first horizontal direction D1. Each of the third and fourth regions 201A and 201B may include a memory cell structure including a plurality of memory cells arranged three-dimensionally.

The semiconductor device 1 according to the example embodiment may further include a lower chip structure 10 below the first memory chip structure 100. The lower chip structure 10, the first memory chip structure 100, and the second memory chip structure 200 may be sequentially stacked and bonded in the vertical direction Z.

The lower chip structure 10 may include a peripheral circuit 8 for operating three-dimensionally arranged memory cells of the first to fourth regions 101A, 101B, 201A, and 201B. For example, the peripheral circuit 8 may include decoder circuits 2a and 2b, page buffers 6a and 6b, and logic circuits 4a and 4b. For example, the peripheral circuit 8 may include a first peripheral circuit 8a and a second peripheral circuit 8b, the first peripheral circuit 8a may include a first decoder circuit 2a, a first page buffer 6a, and a first logic circuit 4a, and the second peripheral circuit 8b may include a second decoder circuit 2b, a second page buffer 6b, and a second logic circuit 4B. As an example, the first peripheral circuit 8a may operate memory cell structures in the first region 101A and the third region 201A overlapping in the vertical direction Z, and the second peripheral circuit 8b may operate the memory cell structures in the second region 101B and the fourth region 201B overlapping in the vertical direction Z.

Figure 2A:
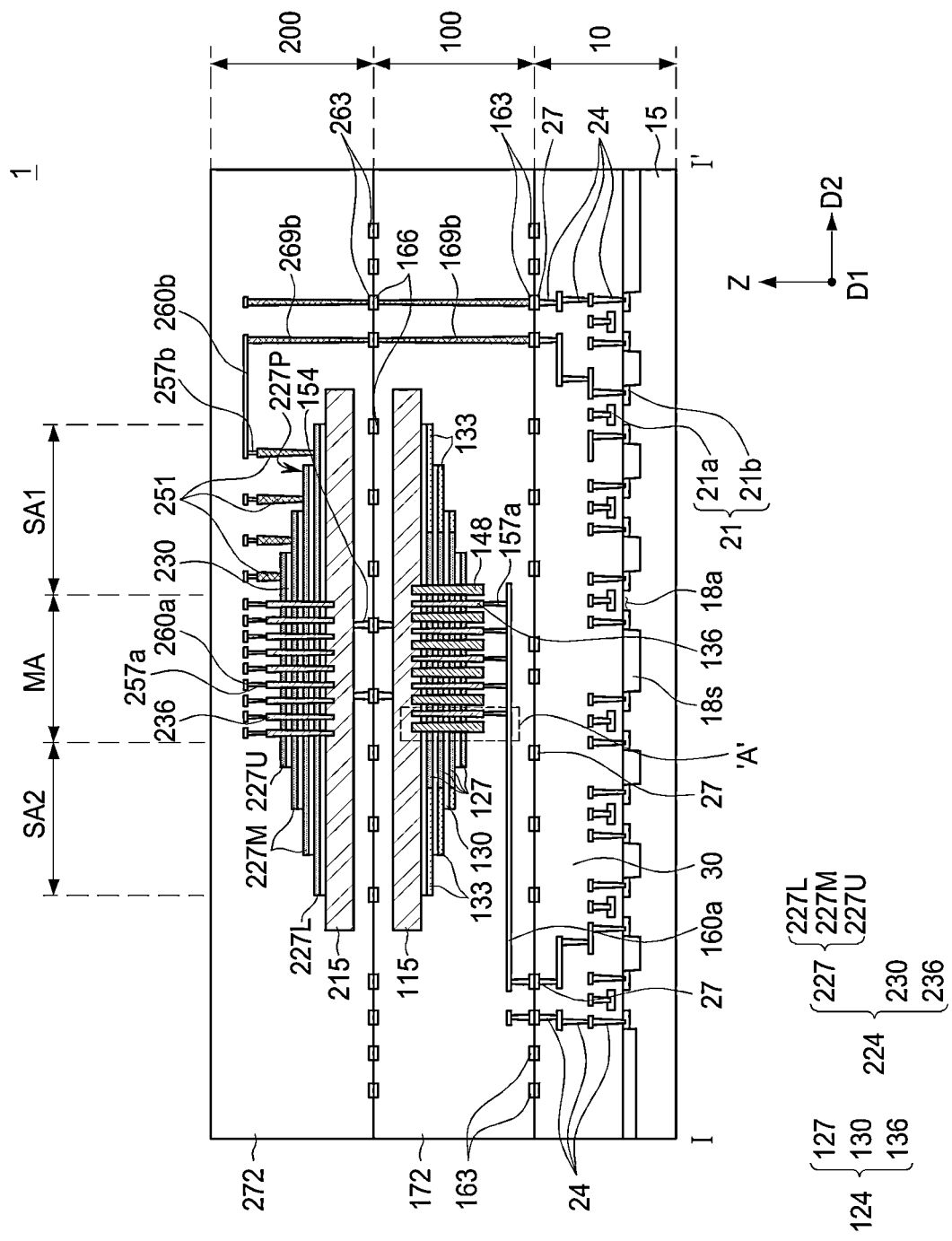
FIGS. 2A, 2B, 3A, and 3B are schematic views illustrating an example of a semiconductor device according to an example embodiment.
Figure 2B:
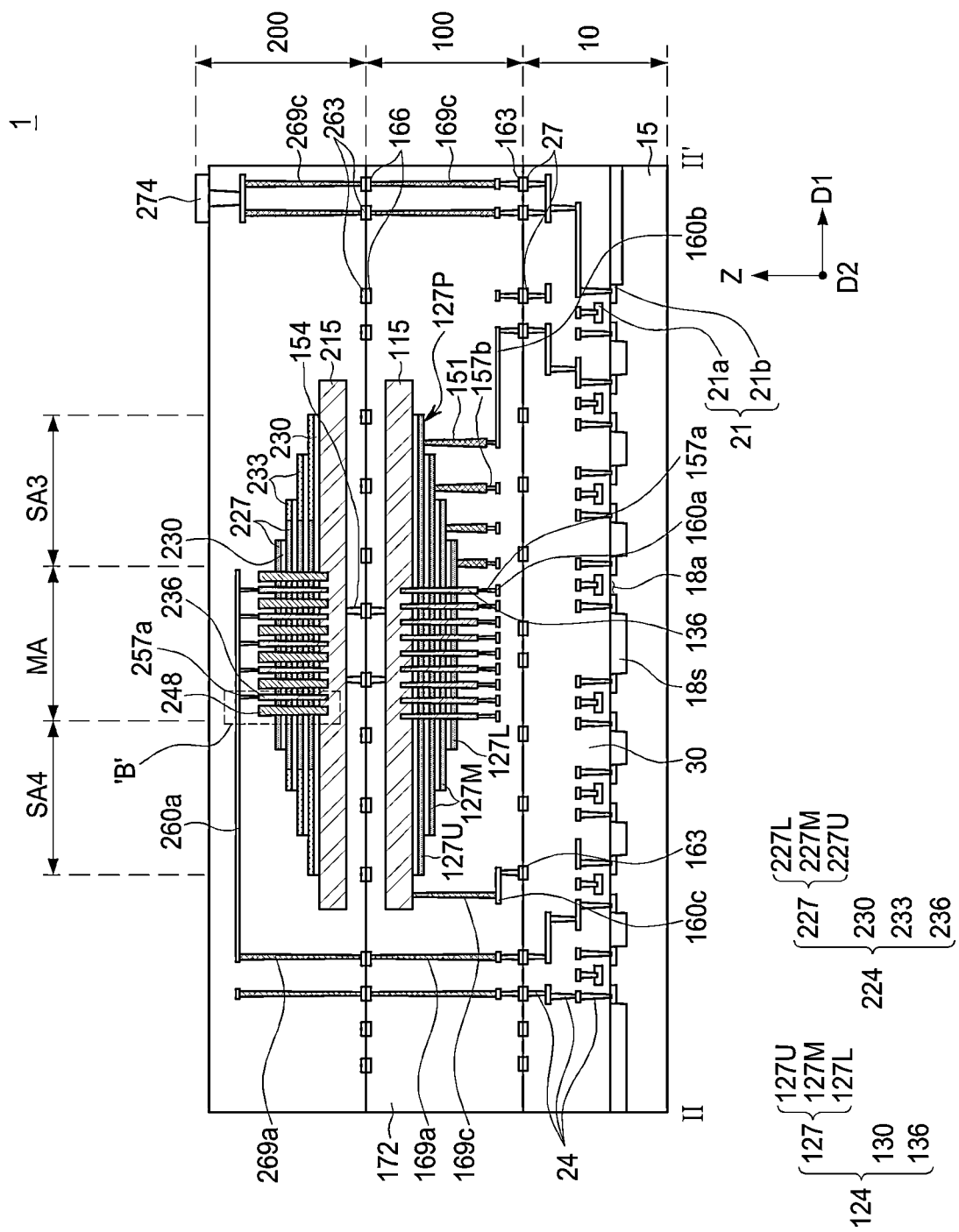
Figure 3A:
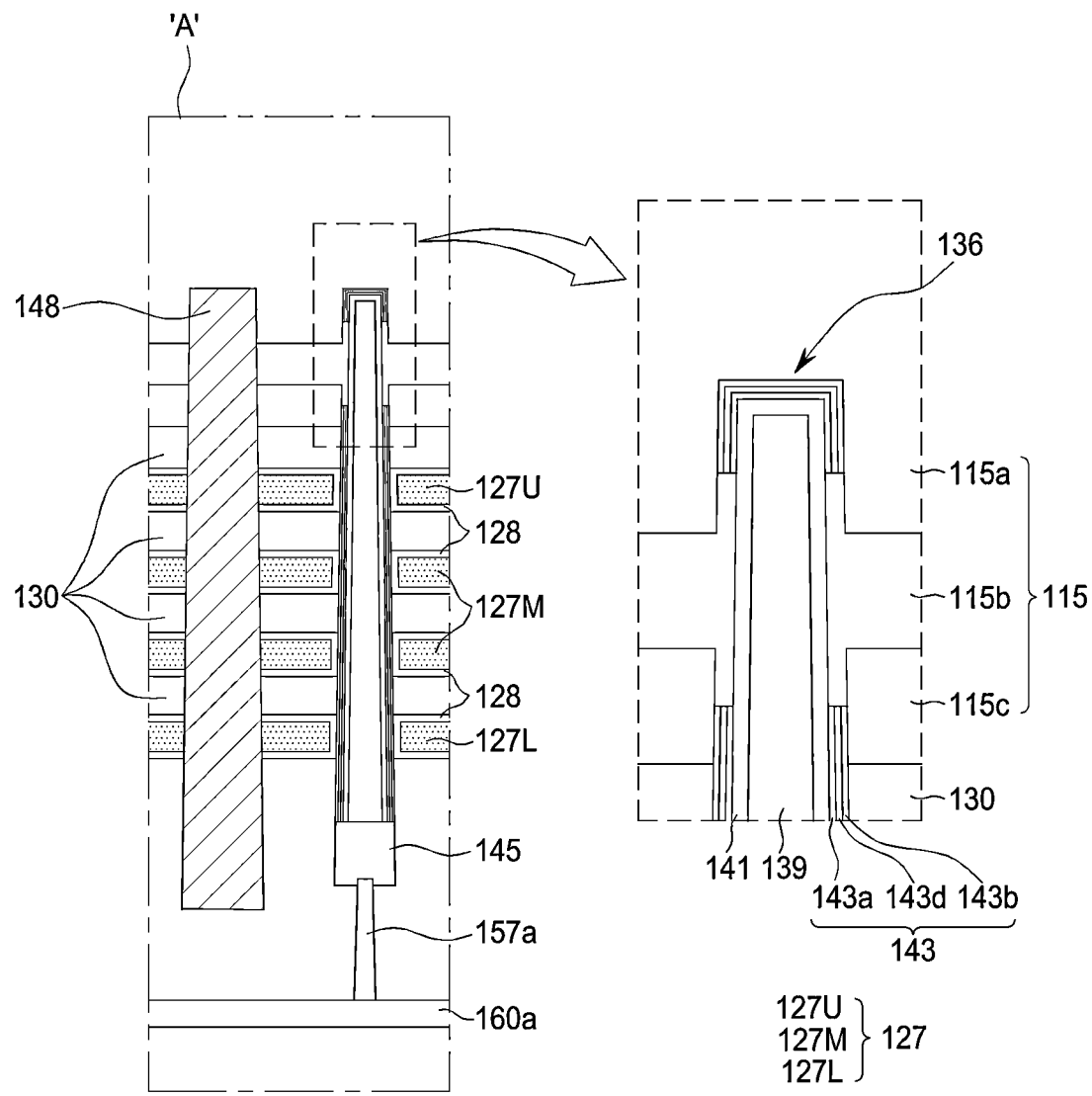
Figure 3B:
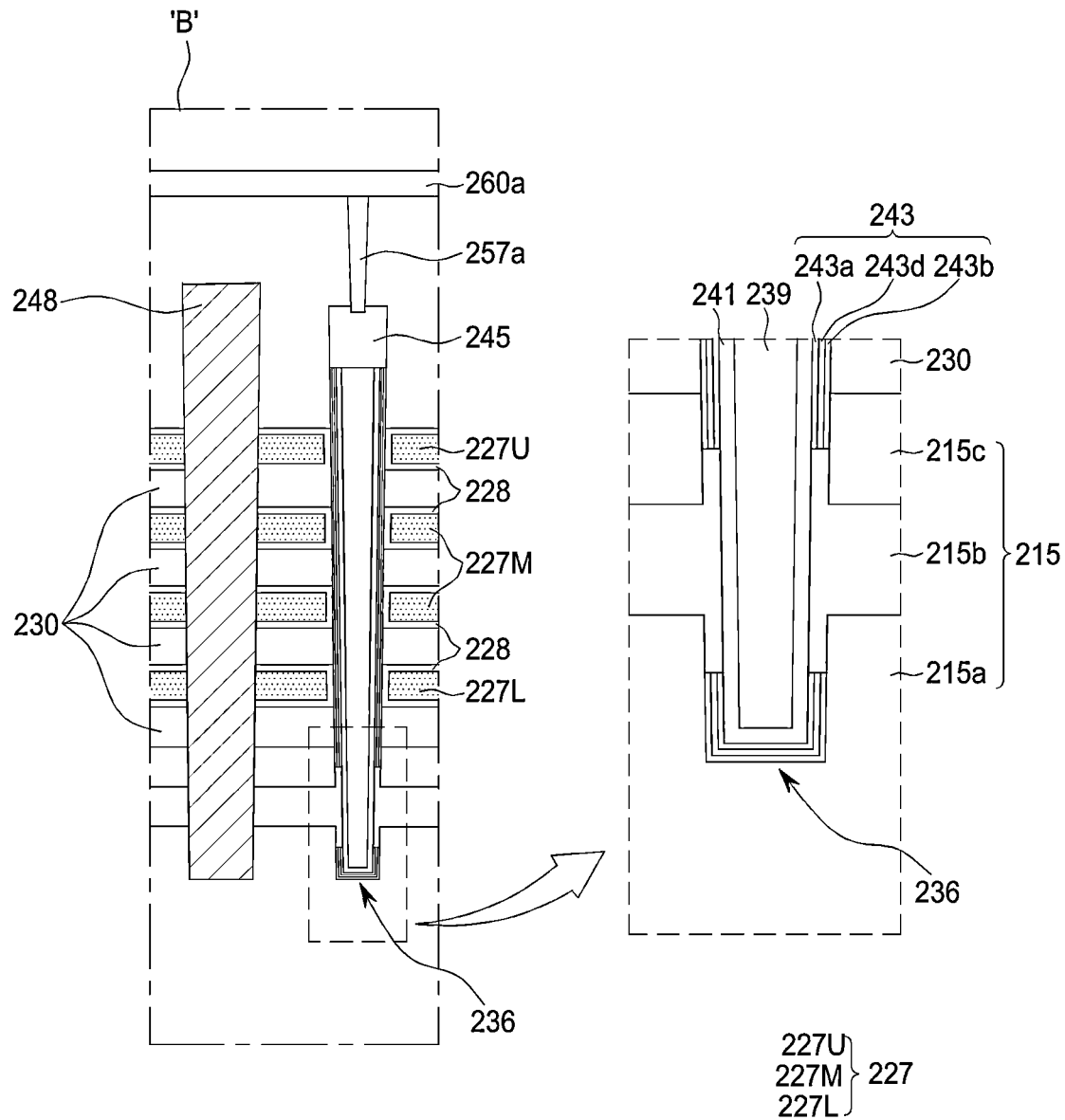

Hereinafter, an example of the semiconductor device 1 will be described with reference to FIGS. 2A, 2B, FIG. 3A, and FIG. 3B. FIG. 2A is a cross-sectional view, taken along the line I-I' of FIG. 1, illustrating a semiconductor device according to an example embodiment, and FIG. 2B is a cross-sectional view, taken along line II-II' of FIG. 1, illustrating the semiconductor device according to an example embodiment, FIG. 3A is a partially enlarged view of region "A" of FIG. 2A, and FIG. 3B is a partially enlarged view of region "B" of FIG. 2B.

Referring to FIGS. 1, 2A, 2B, 3A and 3B, the lower chip structure 10 described in FIG. 1 may further include a semiconductor substrate 15, a semiconductor substrate 15, interconnections 24, and a lower bonding pad structure 27. The semiconductor substrate 15 may be formed of a semiconductor material such as silicon. In the lower chip structure 10, the peripheral circuit 8 (of FIG. 1) may include peripheral elements 21. For example, the peripheral elements 21 may include an active element such as a transistor, including a peripheral gate 21a and a peripheral source/drain 21b, and/or a passive element such as a resistor.

In the peripheral elements 21, the peripheral gate 21a may be disposed on an active region 18a defined by a device isolation layer 18s disposed on the semiconductor substrate 15, and the source/drain 21b may be disposed in the active region 18a.

The interconnections 24 may electrically connect the lower bonding pad structure 27 and the peripheral circuit (8 of FIG. 1), including the peripheral elements 21, to each other. The interconnections 24 may include interconnection lines extending in a horizontal direction, and vias extending in a vertical direction. The lower bonding pad structure 27 may include a plurality of bonding pads electrically connected to the interconnections 24.

The lower chip structure 10 may further include a lower insulating structure 30. The lower insulating structure 30 may cover the peripheral elements 21 and the interconnections 24 on the semiconductor substrate 15, and may cover side surfaces of the lower bonding pads of the lower bonding pad structure 27. An upper surface of the lower insulating structure 30 may be coplanar with an upper surface of the lower bonding pad structure 27.

In the first memory chip structure 100, the first stack structure ST1 described in FIG. 1 may be a first stack structure 124 including first gate lines 127 spaced apart from each other and stacked in a vertical direction Z, as illustrated in FIGS. 2A and 2B. The first stack structure 124 may further include a first interlayer insulating layer 130 stacked repeatedly and alternately with the first gate lines 127. The first gate lines 127 may be formed of doped polysilicon, a metal-semiconductor compound (e.g., TiSi, TaSi, CoSi, NiSi, or WSi), metal nitride (e.g., TiN, TaN, or WN), or a metal (e.g., Ti or W).

When viewed in the cross-sections of FIGS. 2A and 2B, the first gate lines 127 may include a one or more first lower select gate lines 127L, a plurality of first word lines 127M disposed on the one or more first lower select gate lines 127L, and a one or more first upper select gate lines 127U disposed on the plurality of first word lines 127M. For example, the one or more first lower select gate lines 127L may include a string select gate, and the one or more first upper selection gate lines 127U may include a ground select gate.

The first memory chip structure 100 may further include a first common source pattern 115. The first common source pattern 115 may be disposed on the first stack structure 124.

In the first memory chip structure 100, the first separation structures SS1 described with reference to FIG. 1 may be first separation structures 148 penetrating through the first stack structure 124 in the vertical direction Z. The first separation structures 148 may penetrate through the first gate lines 127 of the first stack structure 124 and may be in contact with the first common source pattern 115. For example, the first gate lines 127 may be disposed between the first separation structures 148 adjacent to each other.

As an example, the first separation structures 148 may be formed of an insulating material. As another example, each of the first separation structures 148 may include a conductive pattern and an insulating spacer covering a side surface of the conductive pattern.

The first memory chip structure 100 may further include first vertical memory structures 136 penetrating through the first stack structure 124. The first vertical memory structures 136 may penetrate through the first stack structure 124 and may be in contact with the first common source pattern 115. The first vertical memory structures 136 may be disposed between the first separation structures 148.

Each of the first vertical memory structures 136 may include a gap-fill insulating layer (139 of FIG. 3A), a channel layer (141 of FIG. 3A) covering an external side surface of the gap-fill insulating 139, a data storage structure (143 of FIG. 3A) covering at least a side surface of the channel layer 141, and a pad layer (145 of FIG. 3A) below the gap-fill insulating layer 139, as illustrated in FIG. 3A. The data storage structure 143 may include a first dielectric layer 143*a* in contact with the channel layer 141, a data storage layer 143*d* in contact with the first dielectric layer 143*a*, and a second dielectric layer 143*b* in contact with the data storage layer 143*d*. The data storage layer 143*d* may be disposed between the first dielectric layer 143*a* and the second dielectric layer 143*b*.

The gap-fill insulating layer 139 may include silicon oxide, for example, ALD silicon oxide formed by an atomic layer deposition (ALD) process, or silicon oxide having voids formed therein. The first dielectric layer 143*a* may include silicon oxide, or silicon oxide doped with impurities. The second dielectric layer 143*b* may include at least one of silicon oxide or a high-k dielectric material. The data storage layer 143*d* may include a material (e.g., silicon nitride), which may trap charges. The data storage layer 143*d* may include regions which may store data in a semiconductor device such as a flash memory device. The channel layer 141 may include polysilicon. The pad layer 145 may include at least one of doped polysilicon, metal nitride (e.g., TiN), a metal (e.g., W), or a metal-semiconductor compound (e.g., TiSi). The first stack structure 124 may further include a dielectric layer (128 of FIG. 3A) covering a lower surface and an upper surface of each of the first gate lines 127 and extending between the first gate lines 127 and each of the first vertical memory structures 136. The dielectric layer 128 may include at least one of silicon oxide or a high-dielectric material.

The first common source pattern 115 may include a first pattern layer (115*a* of FIG. 3A), a second pattern layer (115*b* of FIG. 3A) below the first pattern layer 115*a*, and a third pattern layer (115*c* of FIG. 3A) below the second pattern layer 115*b*, as illustrated in FIG. 3A. At least one of the first pattern layer 115*a*, the second pattern layer 115*b*, and the third pattern layer 115*c* may include a polysilicon layer (e.g., a polysilicon layer having N-type conductivity). Each of the first vertical memory structures 136 may penetrate through the second and third patterned layers 115*b* and 115*c* and may be in contact with the first patterned layer 115*a*. The second pattern layer 115*b* may penetrate through the data storage structure 143 and may be in contact with the channel layer 141.

The first stack structure 124 may include a stack region MA having first and second sides opposing each other and third and fourth sides opposing to each other, a first staircase region SA1 disposed on the first side of the stack region MA, a second staircase region SA2 disposed on the second side of the stack region MA, a third staircase region SA3 disposed on the third side of the stack region MA, and a fourth staircase region SA4 disposed on the fourth side of the stack region MA. Accordingly, in the first stack structure 124, the stack region MA may be disposed between the first and second staircase regions SA1 and SA2 and between the third and fourth staircase regions SA3 and SA4.

In the first stack structure 124, the first gate lines 127 may include gate pads 127P sequentially stacked in the stack region MA and extending in the third and fourth staircase regions SA3 and SA4 to be arranged in the form of a staircase in the third and fourth staircase regions SA3 and SA4.

The first stack structure 124 may further include first dummy insulating patterns 133 disposed in the first and second staircase regions SA1 and SA2. At least some of the first gate lines 127 may be disposed on substantially the same level as the first dummy insulating patterns 133. The first dummy insulating patterns 133 may be formed of a material different from that of the first interlayer insulating layers 130. For example, the first dummy insulating patterns 133 may be formed of silicon nitride, and the first interlayer insulating layers 130 may be formed of silicon oxide.

The first memory chip structure 100 may further include first gate contact plugs 151 disposed below the third staircase region SA3 of the first stack structure 124 and electrically connected to the first gate pads 127P of the first gate lines 127.

The first memory chip structure 100 may further include a source contact plug 154 that is provided below the first common source pattern 115 and is electrically connected to the first common source pattern 115.

The first memory chip structure 100 further includes first bit lines 160*a* that are provided at a lower level than the first vertical memory structures 136 and are electrically connected to the first vertical memory structures 136. The first memory chip structure 100 may further include first bit line studs 157*a* between the first vertical memory structures 136 and the first bit lines 160*a*.

The first memory chip structure 100 may further include first gate connection lines 160*b* electrically connected to the first gate contact plugs 151 on a lower level than the first gate contact plugs 151. The first memory chip structure 100 may further include first gate studs 157*b* between the first gate contact plugs 151 and the first gate connection lines 160*b*.

The first memory chip structure 100 may further include a source connection line 160*c* electrically connected to the source contact plug 154 on a lower level than the source contact plug 154. The first memory chip structure 100 may further include a source stud 157c between the source contact plug 154 and the source connection line 160c.

The first memory chip structure 100 may further include a first intermediate bonding pad structure 163. The first intermediate bonding pad structure 163 may be bonded to the lower bonding pad structure 27 of the lower chip structure 10 while being in contact with the lower bonding pad structure 27 of the lower chip structure 10. The first intermediate bonding pad structure 163 may include pads electrically connected to the first bit lines 160a, the first gate connection lines 160b, and the source connection line 160c, respectively. The first intermediate bonding pad structure 163 and the lower bonding pad structure 27 may include a copper material.

The first memory chip structure 100 may further include a second intermediate bonding pad structure 166. The second intermediate bonding pad structure 166 may be disposed on the first common source pattern 115. The second intermediate bonding pad structure 166 may include pads electrically connected to the first common source pattern 115.

The first memory chip structure 100 may further include an intermediate insulating structure 172. A lower surface of the intermediate insulating structure 172 may be coplanar with a lower surface of the first intermediate bonding pad structure 163, and an upper surface of the intermediate insulating structure 172 may be coplanar with an upper surface of the second intermediate bonding pad structure 166. The first common source pattern 115 and the first stack structure 124 may be buried in the intermediate insulating structure 172.

The first memory chip structure 100 may further include a lower bit line connection plug 169a, a lower gate connection plug 169b, and a lower input/output connection plug 169c. Each of the lower bit line connection plug 169a, the lower gate connection plug 169b, and the lower input/output connection plug 169c may be electrically connected to some pads of the first intermediate bonding pad structure 163 and some pads of the second intermediate bonding pad structure 166 between the first intermediate bonding pad structure 163 and the second intermediate bonding pad structure 166.

In the second memory chip structure 200, the second stack structure ST2 described in FIG. 1 may be a second stack structure 224 including second gate lines 227 spaced apart from each other and stacked in the vertical direction Z, as illustrated in FIGS. 2A and 2B. The second stack structure 224 may further include second interlayer insulating layers 230 stacked repeatedly and alternately with the second gate lines 227. The gate lines 227 may be formed of doped polysilicon, a metal-semiconductor compound (e.g., TiSi, TaSi, CoSi, NiSi, or WSi), metal nitride (e.g., TiN, TaN, or WN), or a metal (e.g., Ti or W).

When viewed in the cross-sections of FIGS. 2A and 2B, the second gate lines 227 may include a one or more second lower select gate lines 227L, a plurality of second word lines 227M disposed on the one or more second lower select gate lines 227L, and a one or more upper select gate lines 227U disposed on the second word lines 227M. For example, the one or more second lower select gate lines 227L may include a string select gate, and the one or more second upper select gate lines 227U may include a ground select gate.

The second memory chip structure 200 may further include a second common source pattern 215. The second common source pattern 215 may be disposed below the second stack structure 224.

In the second memory chip structure 200, the second separation structures SS2 described in FIG. 1 may be second separation structures 248 penetrating through the second stack structure 224 in the vertical direction Z. The second separation structures 248 may penetrate through the second gate lines 227 of the second stack structure 224 and may be in contact with the second common source pattern 215. For example, the second gate lines 227 may be disposed between the second separation structures 248. As an example, the second separation structures 248 may be formed of an insulating material. As another example, each of the second separation structures 248 may include a conductive pattern and an insulating spacer surrounding a side surface of the conductive pattern. The second memory chip structure 200 may further include second vertical memory structures 236 penetrating through the second stack structure 224. The second vertical memory structures 236 may penetrate through the second stack structure 224 and may be in contact with the second common source pattern 215. The second vertical memory structures 236 may be disposed between the second separation structures 248.

Each of the second vertical memory structures 236 may include a gap-fill insulating layer (239 of FIG. 3B), a channel layer (241 of FIG. 3B) covering at least an external side surface of the gap-fill insulating layer 239, a data storage structure (243 of FIG. 3B) covering at least a side surface of the channel layer 241, and a pad layer (245 of FIG. 3B) in contact with the channel layer 241 on the gap-fill insulating layer 239, as illustrated in FIG. 3B. The data storage structure 243 may include a first dielectric layer 243a in contact with the channel layer 241, a data storage layer 243d in contact with the first dielectric layer 243a, and a second dielectric layer 243b in contact with the data storage layer 243d. The data storage layer 243d may be disposed between the first dielectric layer 243a and the second dielectric layer 243b. The gap-fill insulating layer 239 may include silicon oxide (e.g., ALD silicon oxide formed by an atomic layer deposition (ALD) process or silicon oxide having voids formed therein). The first dielectric layer 243a may include silicon oxide or silicon oxide doped with impurities. The second dielectric layer 243b may include at least one of silicon oxide or a high-k dielectric material. The data storage layer 243d may include a material which may trap charges, for example, silicon nitride. The data storage layer 243d may include regions in which data may be stored, in a semiconductor device such as a flash memory device. The channel layer 241 may include polysilicon. The pad layer 245 may include at least one of doped polysilicon, a metal nitride (e.g., TiN or the like), a metal (e.g., W), or a metal-semiconductor compound (e.g., TiSi). The second stack structure 224 may further include a dielectric layer (228 of FIG. 3B) covering a lower surface and an upper surface of each of the second gate lines 227 and extending between the second gate lines 227 and each of the second vertical memory structures 236. The dielectric layer 228 may include at least one of silicon oxide or a high-k dielectric material.

The second common source pattern 215 may include a first pattern layer (215a of FIG. 3B), a second pattern layer (215b of FIG. 3B) on the first pattern layer 215a, and a third pattern layer (215c of FIG. 3B) on the second pattern layer 215b, as illustrated in FIG. 3B. At least one of the first pattern layer 215a, the second pattern layer 215b, and the third pattern layer 215c may include a polysilicon layer (e.g., a polysilicon layer having N-type conductivity). Each of the second vertical memory structures 236 may penetrate through the second and third pattern layers 215b and 215c and may be in contact with the first pattern layer 215a. The second pattern layer 215b may penetrate through the data storage structure 243 and may be in contact with the channel layer 241.

The second stack structure 224 may include a stack region MA having a first side and a second side opposing each other and a third side and a fourth side opposing each other, a first staircase region SA1 disposed on the first side of the stack region MA, a second staircase region SA2 disposed on the second side of the stack region MA, a third staircase region SA3 disposed on the third side of the stack region MA, and a fourth staircase region SA4 disposed on the fourth side of the stack region MA. Accordingly, in the second stack structure 224, the stack region MA may be disposed between the first and second staircase regions SA1 and SA2 and between the third and fourth staircase regions SA3 and SA4.

The stack region MA of the second stack structure 224 may overlap the stack region MA of the first stack structure 124. The first staircase region SA1 of the second stack structure 224 may overlap the first staircase region SA1 of the first stack structure 124, the second staircase region SA2 of the second stack structure 224 may overlap the second staircase region SA2 of the first stack structure 124, the third staircase region SA3 of the second stack structure 224 may overlap the third staircase region SA3 of the first stack structure 124, and the fourth staircase region SA4 of the second stack structure 224 may overlap the fourth staircase region SA4 of the first stack structure 124.

In the second stack structure 224, the second gate lines 227 may include gate pads 227P (e.g., gate pad portions) sequentially stacked in the stack region MA and extending in the first and second staircase regions SA1 and SA2 to be arranged in the form of a staircase in the first and second staircase regions SA1 and SA2.

The second stack structure 224 may further include second dummy patterns 233 disposed in the third and fourth staircase regions SA3 and SA4. Some of the second gate lines 227 may be disposed on substantially the same level as the second dummy insulating patterns 233. The second dummy insulating patterns 233 may be formed of a material different from that of the second interlayer insulating layers 230. For example, the second dummy insulating patterns 233 may be formed of silicon nitride, and the second interlayer insulating layers 230 may be formed of silicon oxide.

The second memory chip structure 200 may further include second gate contact plugs 251 disposed on the first staircase region SA1 of the second stack structure 224 and electrically connected to the second gate pads 227p of the second gate lines 227.

The second memory chip structure 200 may further include second bit lines 260a that are provided on a higher level than the second vertical memory structures 236 and are electrically connected to the second vertical memory structures 236. The second memory chip structure 200 may further include second bit line studs 257a between the second vertical memory structures 236 and the second bit lines 260a.

The second memory chip structure 200 may further include second gate connection lines 260b that are provided at a higher level than the second gate contact plugs 251 and are electrically connected to the second gate contact plugs 251. The second memory chip structure 200 may further include second gate studs 257b between the second gate contact plugs 251 and the second gate connection lines 260b.

The second memory chip structure 200 may further include an upper bonding pad structure 263 below the second common source pattern 215. The upper bonding pad structure 263 may be bonded to the second intermediate bonding pad structure 166 of the first memory chip structure 100 while being in contact with the second intermediate bonding pad structure 166 of the first memory chip structure 100. The upper bonding pad structure 263 may include pads electrically connected to the second common source pattern 215. The upper bonding pad structure 263 and the second intermediate bonding pad structure 166 may include a copper material.

The second memory chip structure 200 may further include an upper insulating structure 272. A lower surface of the upper insulating structure 272 may be coplanar with a lower surface of the upper bonding pad structure 263. The second common source pattern 215 and the second stack structure 224 may be buried in the upper insulating structure 272.

The second memory chip structure 200 may include an upper bit line connection plug 269a, an upper gate connection plug 269b, and an upper input/output connection plug 269c. Each of the upper bit line connection plug 269a, the upper gate connection plug 269b, and the upper input/output connection plug 269c may be electrically connected to the pads of the upper bonding pad structure 263.

The second memory chip structure 200 may further include an input/output pad 274 on the upper insulating structure 272. The input/output pad 274 may be electrically connected to an input/output pad of the logic circuits (4a and 4b of FIG. 1) through the upper input/output connection plug 269c, some pads of the upper bonding pad structure 263, some pads of the second intermediate bonding pad structure 166, the lower input/output connection plug 169c, some pads of the first intermediate bonding pad structure 163, some pads of the lower bonding pad structure 27, and the interconnections 24.

Each of the first gate lines 127 may be in the form of a line extending in the first horizontal direction D1, an each of the second gate lines 227 may be in the form of a line extending in the second horizontal direction D2, perpendicular to the first horizontal direction D1. For example, each of the first word lines 127M may extend in the first horizontal direction D1, and each of the second word lines 227M may extend in the second horizontal direction D2.

Each of the first separation structure 148 may be in the form of a line extending in the first horizontal direction D1, and each of the second separation structures 248 may be in the form of a line extending in the second horizontal direction D2.

Each of the first bit lines 160a may be in the form of a line extending in the second horizontal direction D2, and each of the second bit lines 260a may be in the form of a line extending in the first horizontal direction D1.

The second bit lines 260a may be electrically connected to the page buffers (6a and 6b of FIG. 1) through the upper bit line connection plug 269a, some pads of the upper bonding pad structure 263, some pads of the second intermediate bonding pad structure 166, the lower bit line connection plug 169a, some pads of the first intermediate bonding pad structure 163, some pads of the lower bonding pad structure 27, and the interconnections 24.

The second gate lines 227 may be electrically connected to the decoder circuits (2a and 2b of FIG. 1) through the second gate contact plugs 251, the second gate connection lines 260b, the upper gate connection plugs 269b, some pads of the upper bonding pad structure 263, some pads of the second intermediate bonding pad structure 166, the lower gate connection plug 169b, some pads of the first intermediate bonding pad structure 163, some pads of the lower bonding pad structure 27, and the interconnections 24.

The decoder circuits (2a and 2b of FIG. 1) and the page buffers (6a and 6b of FIG. 1) may perform a control operation on memory transistors which include the gate lines 127 and 227 and the vertical memory structures 136 and 236. For example, a certain word line 127M, among the first gate lines 127, the channel layer (141 of FIG. 3A) of a certain vertical memory structure, among the first vertical memory structures 136, and the data storage structure (143 of FIG. 3A) may constitute a memory cell transistor, and the decoder circuits (2a and 2b of FIG. 1) and the page buffer (6a and 6b of FIG. 1) may perform a control operation on the memory cell transistor. The decoder circuits (2a and 2b of FIG. 1) and the page buffer (6a and 6b of FIG. 1) may be controlled by the logic circuits (4a and 4b of FIG. 1). Accordingly, as described in FIG. 1, the first peripheral circuit (8a of FIG. 1) may operate a memory cell structure including memory cell transistors in the first region 101A and the third region 201A overlapping in the vertical direction Z, and the second peripheral circuit 8b may operate memory cell structures including memory cell transistors in the second region 101B and the fourth region 201B overlapping in the vertical direction Z.

Hereinafter, various modified examples of the above-described semiconductor device 1 will be described. Hereinafter, among the above-described components, modified or replaced components will be mainly described, and the description of unmodified components will be omitted or will be directly cited without an additional description. Accordingly, in the modified examples described below, among the components illustrated in the drawings, components which are not additionally described may be construed to be substantially the same as those described above.

Figure 4:
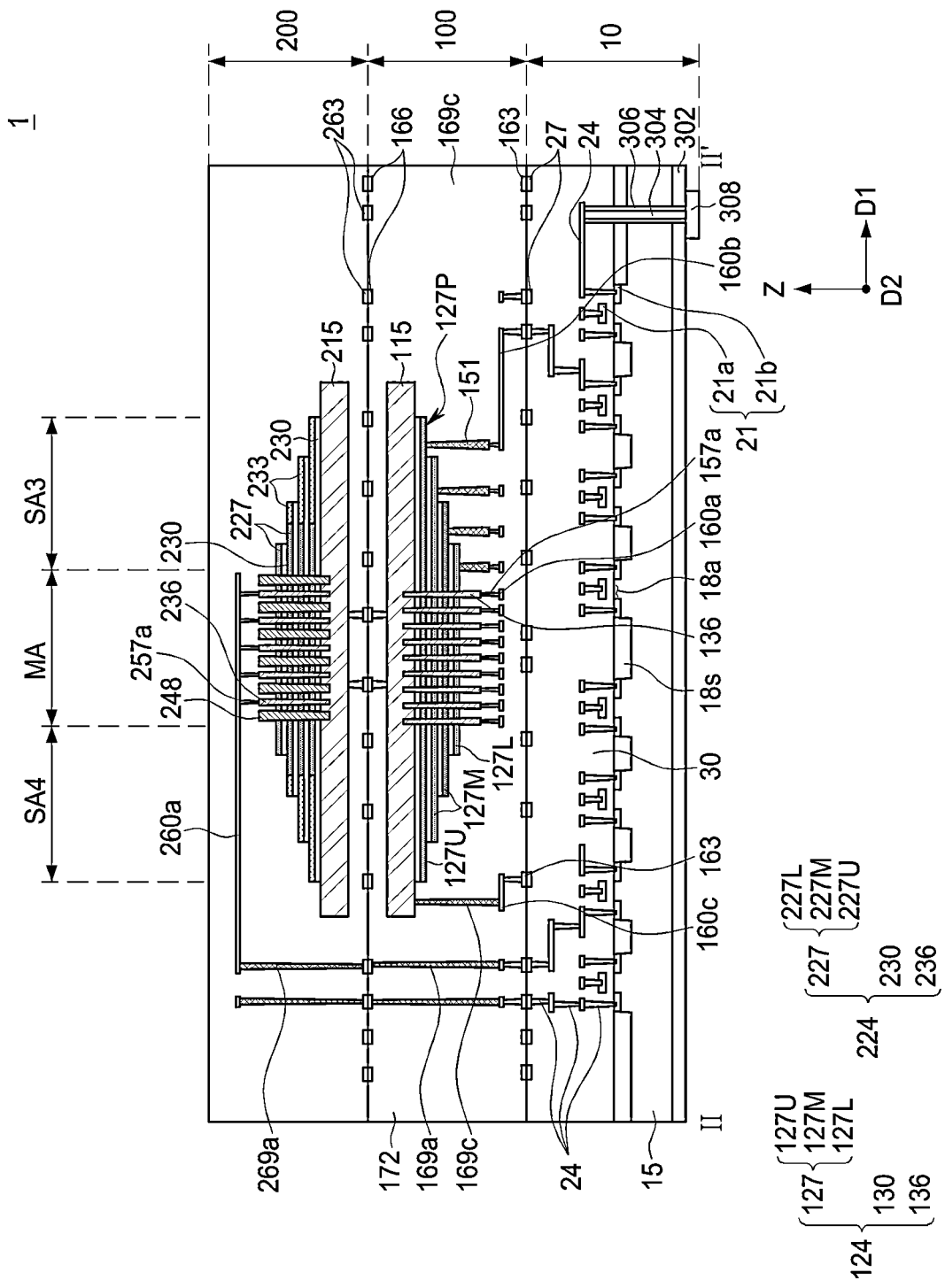
FIG. 4 is a cross-sectional view illustrating a modified example of a semiconductor device according to an example embodiment.

Next, a modified example of the input/output pad 274 in FIG. 2B will be described with reference to FIG. 4. FIG. 4 is a cross-sectional view illustrating a region taken along line II-II' of FIG. 1 to illustrate a modified example of the semiconductor device according to an example embodiment.

In the modified example, referring to FIG. 4, the input/output pad (274 of FIG. 2B) may be replaced with an input/output pad 308 disposed below the lower chip structure 10. Accordingly, the lower chip structure 10 may further include a rear insulating layer 302 in contact with a lower surface of the semiconductor substrate 15, an input/output through-electrode 304 penetrating through the semiconductor substrate 15 and the rear insulating layer 302 to be in contact with a portion of the interconnections 24, and an insulating spacer 306 covering a side surface of the input/output through-electrode 304.

Figure 5A:
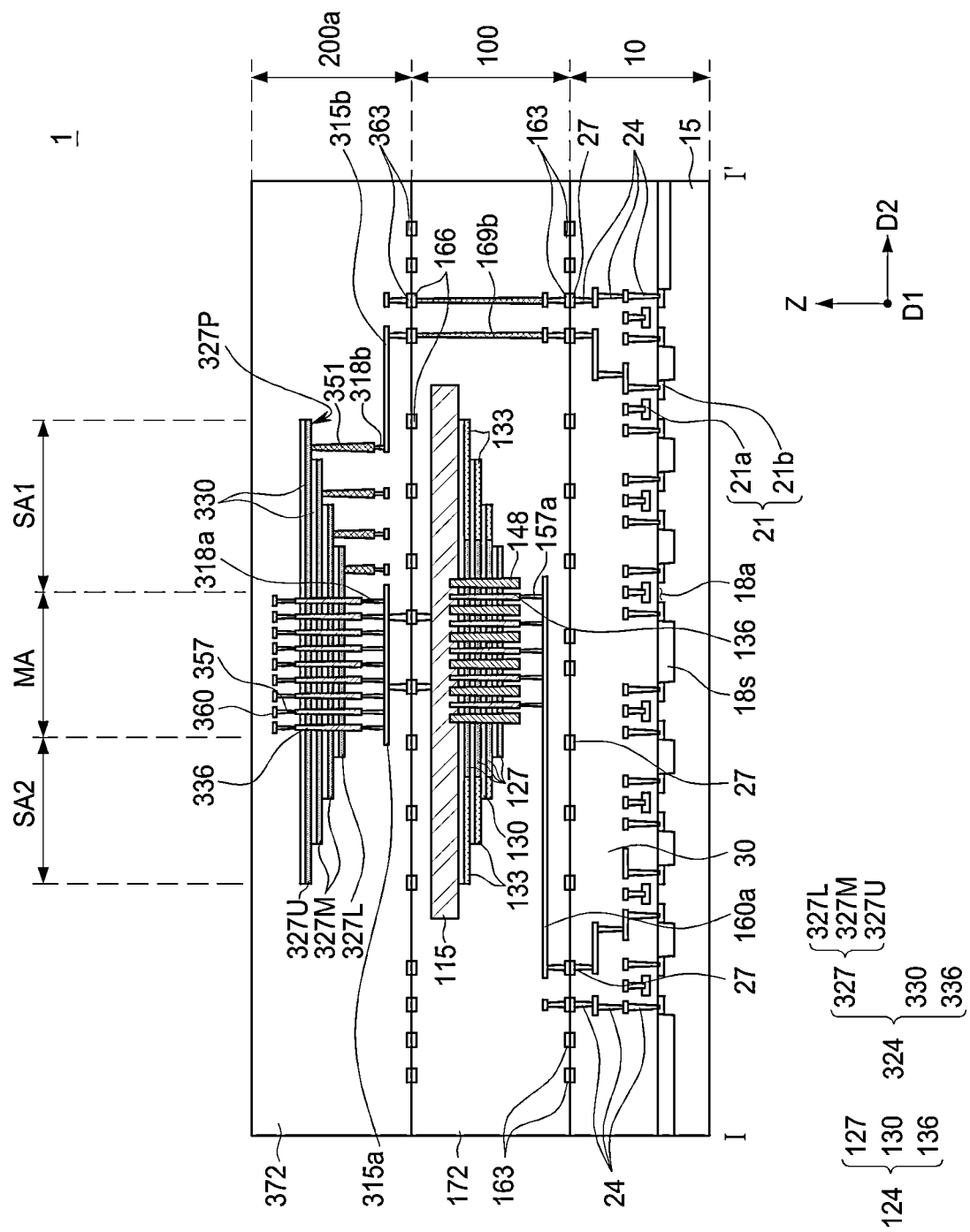
FIGS. 5A, 5B, and 6 are schematic views illustrating a modified example of a semiconductor device according to an example embodiment.

Next, a modified example of the semiconductor device according to an example embodiment of the present disclosure will be described with reference to FIGS. 5A, 5B, and 6. FIG. 5A is a cross-sectional view illustrating a region taken along line I-I' of FIG. 1 to illustrate a modified example of the semiconductor device according to an example embodiment, FIG. 5B is cross-sectional view illustrating a region taken along line II-II' of FIG. 1 to illustrate a modified example of the semiconductor device according to an example embodiment, and FIG. 6 is a partially enlarged view of region "C" of FIG. 5B.

Figure 5B:
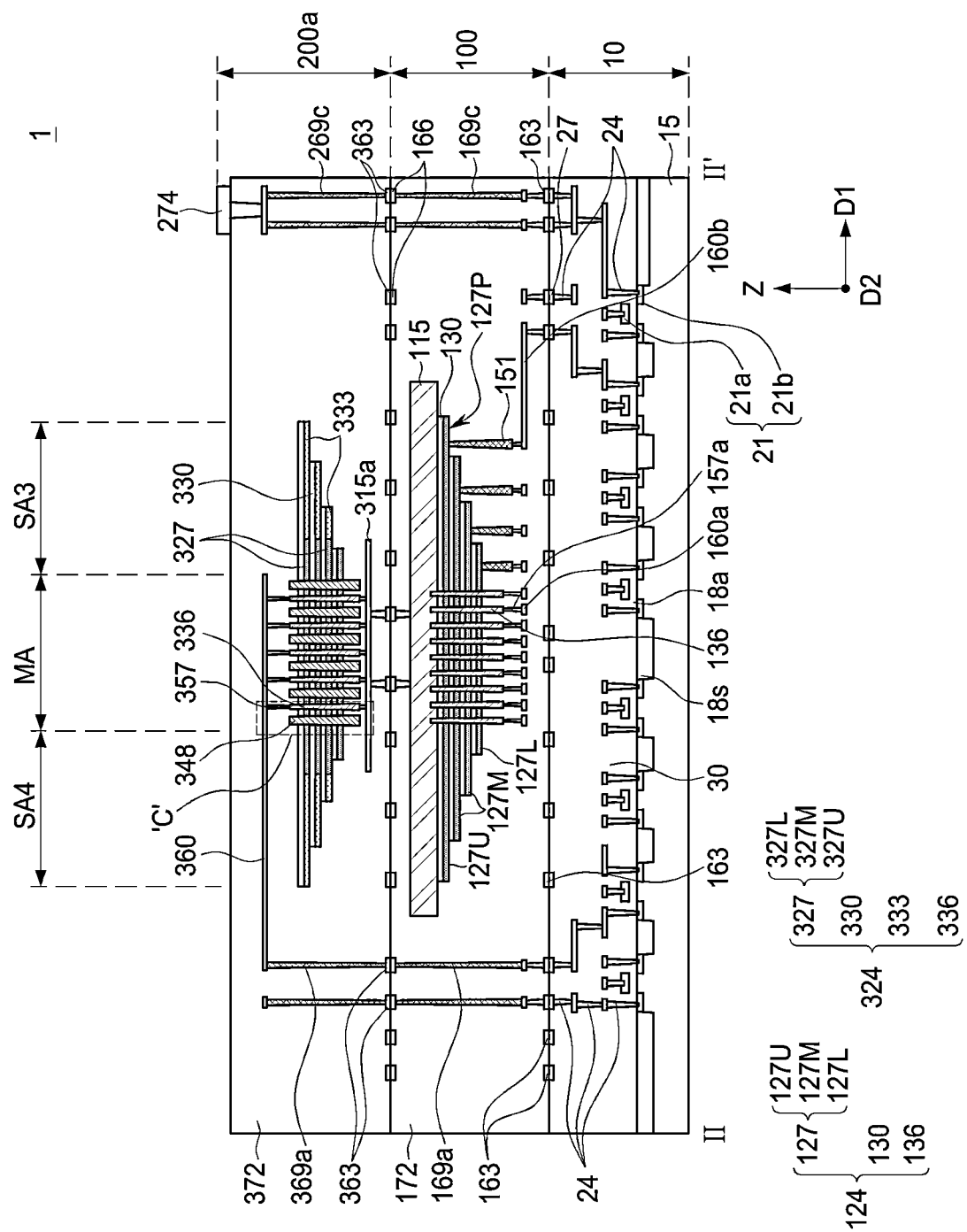
Figure 6:
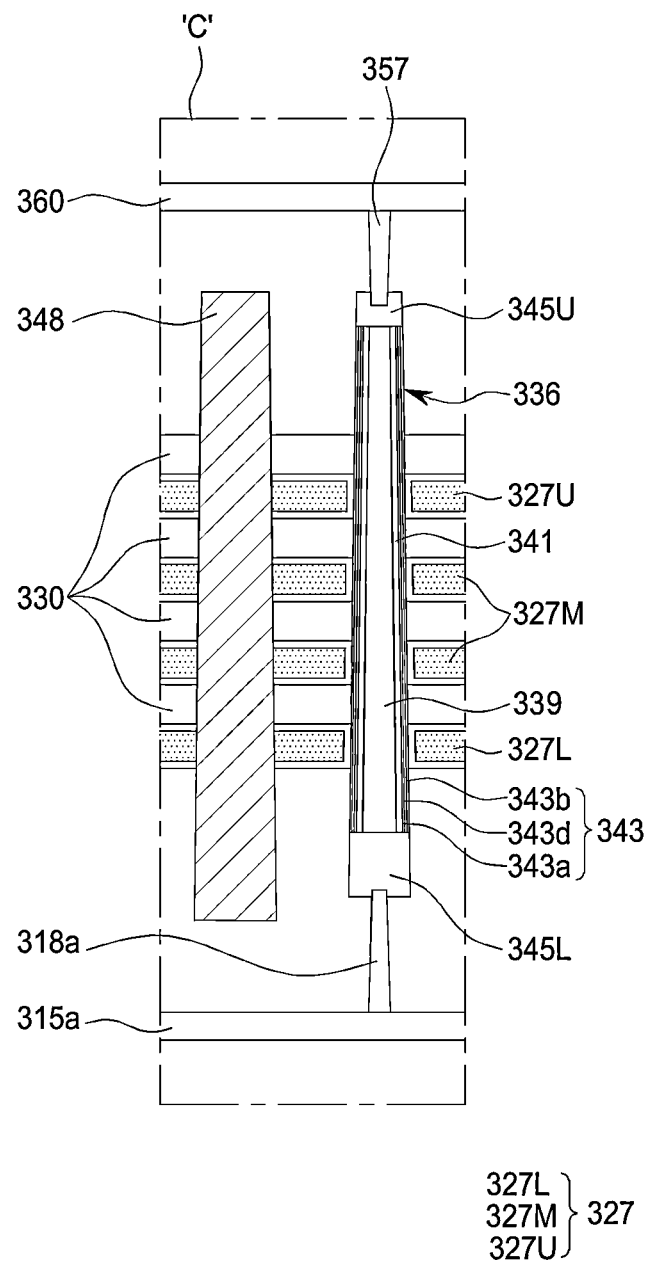

In the modified example, referring to FIGS. 5A, 5B, and 6, the second memory chip structure 200 of FIGS. 2A and 2B may be replaced with a second memory chip structure 200a of FIGS. 5A and 5B. For example, the second memory chip structure 200a may include a second stack structure 324 including second interlayer insulating layers 330 and second gate lines 327 alternately stacked in a vertical direction Z, second separation structures 348 penetrating through the second gate lines 327 of the second stack structure 324, and second vertical memory structures 336 penetrating through the second gate lines 327 between the second separation structures 348.

The second gate lines 327 may include a one or more second lower select gate lines 327L, a plurality of word lines 327M disposed on the one or more second lower select gate lines 327L, and a one or more upper select gate lines 327U disposed on the second word lines 327M.

When viewed in a cross-sectional structure of FIG. 5A, lengths of the second gate lines 327 may be relatively increased in a direction toward an upper portion from a lower portion thereof.

As illustrated in FIG. 6, each of the second vertical memory structures 336 may include a gap-fill insulating layer (339 of FIG. 6), a channel layer (341 of FIG. 6) covering an external side surface of at least the gap-fill insulating layer 339, a data storage structure (343 of FIG. 6), covering a side surface of at least one channel layer 341, an upper pad layer (345U of FIG. 6) in contact with the channel layer 341 above the gap-fill insulating layer 339, and a lower pad layer (345L of FIG. 6) in contact with the channel layer 341 below the gap-fill insulating layer 339.

The data storage structure 343 may include a first dielectric layer 343a in contact with the channel layer 341, a data storage layer 343d in contact with the first dielectric layer 343a, and a second dielectric layer 343b in contact with the data storage layer 343d. The data storage layer 343d may be disposed between the first dielectric layer 343a and the second dielectric layer 343b. The lower pad layer 345L may include polysilicon having N-type conductivity. For example, the lower pad layer 345L may be a source region. The upper pad layer 345U may include polysilicon having N-type conductivity. For example, the upper pad layer 345U may be a drain region.

The second memory chip structure 200a may further include a second common source pattern 315a that is provided below the second vertical memory structure 336 and is electrically connected to the second vertical memory structures 336, and second bit lines 360 that are provided above the second vertical memory structures 336 and are electrically connected to the second vertical memory structures 336.

The second common source pattern 315a may be electrically connected to the lower pad layers 345L of the second vertical memory structures 336 through source studs 318a. The second bit lines 360 may be electrically connected to the upper pad layers 345U of the second vertical memory structures 336 through bit line studs 375.

Similarly to the second stack structure 224 of FIGS. 2A and 2B, the second stack structure 324 may include a stack region MA overlapping the stack region MA of the first stack structure 124, a first staircase region SA1 overlapping the first staircase region SA1 of the first stack structure 124, a second staircase region SA2 overlapping the second staircase region SA2 of the first stack structure 124, a third staircase region SA3 overlapping the third staircase region SA3 of the first stack structure 124, and a fourth staircase region SA4 overlapping the fourth staircase region SA4 of the first stack structure 124.

The second stack structure 324 may further include second dummy insulating patterns 333 disposed in the third and fourth staircase regions SA3 and SA4. Some of the second gate lines 327 may be disposed on substantially the same level as the second dummy insulating patterns 333. The second dummy insulating patterns 333 may be formed of a material different from that of the second interlayer insulating layers 330. For example, the second dummy insulating patterns 333 may be formed of silicon nitride, and the second interlayer insulating layer 330 may be formed of silicon oxide.

The second memory chip structure 200a may further include second gate contact plugs 351 that are disposed below the first staircase region SA1 of the second stack structure 324 and electrically connected to the second gate pads 327P of the second gate lines 327.

The second memory chip structure 200a may further include second gate interconnections 315b that are provided at a lower level than the second gate contact plugs 351 and are electrically connected to the second gate contact plugs 351 through gate studs 318b.

The second memory chip structure 200a may further include an upper bonding pad structure 363 below the second common source pattern 315a. The upper bonding pad structure 363 may be bonded to the second intermediate bonding pad structure 166 of the first memory chip 100 while being in contact with the second intermediate bonding pad structure 166 of the first memory chip 100. The upper bonding pad structure 363 may include pads electrically connected to the second common source pattern 315a and the second gate interconnections 315b.

The second memory chip structure 200a may further include an upper insulating structure 372. A lower surface of the upper insulating structure 372 may be coplanar with a lower surface of the upper bonding pad structure 363. The second common source pattern 315a and the second stack structure 324 may be buried in the upper insulating structure 372.

The second memory chip structure 200a may further include upper bit line connection plugs 369a. The upper bit line connection plugs 369a may be between some pads of the upper bonding structure and the second bit lines 360 and electrically connect some pads of the upper bonding pad structure 363 and the second bit lines 360 to each other. The second memory chip structure 200a may further include an upper input/output connection plug 269c and the input/output pad 274, which are substantially the same as those described in FIG. 2B.

Similarly to the second gate line 227, the second separation structures 248, and the second bit lines 260a described above, each of the second gate lines 327 may be in the form of a line extending in the second horizontal direction D2, each of the second separation structures 348 may be in the form of a line extending in the second horizontal direction D2, and each of the second bit lines 360 may be in the form of a line extending in the first horizontal direction D1.

Figure 7:
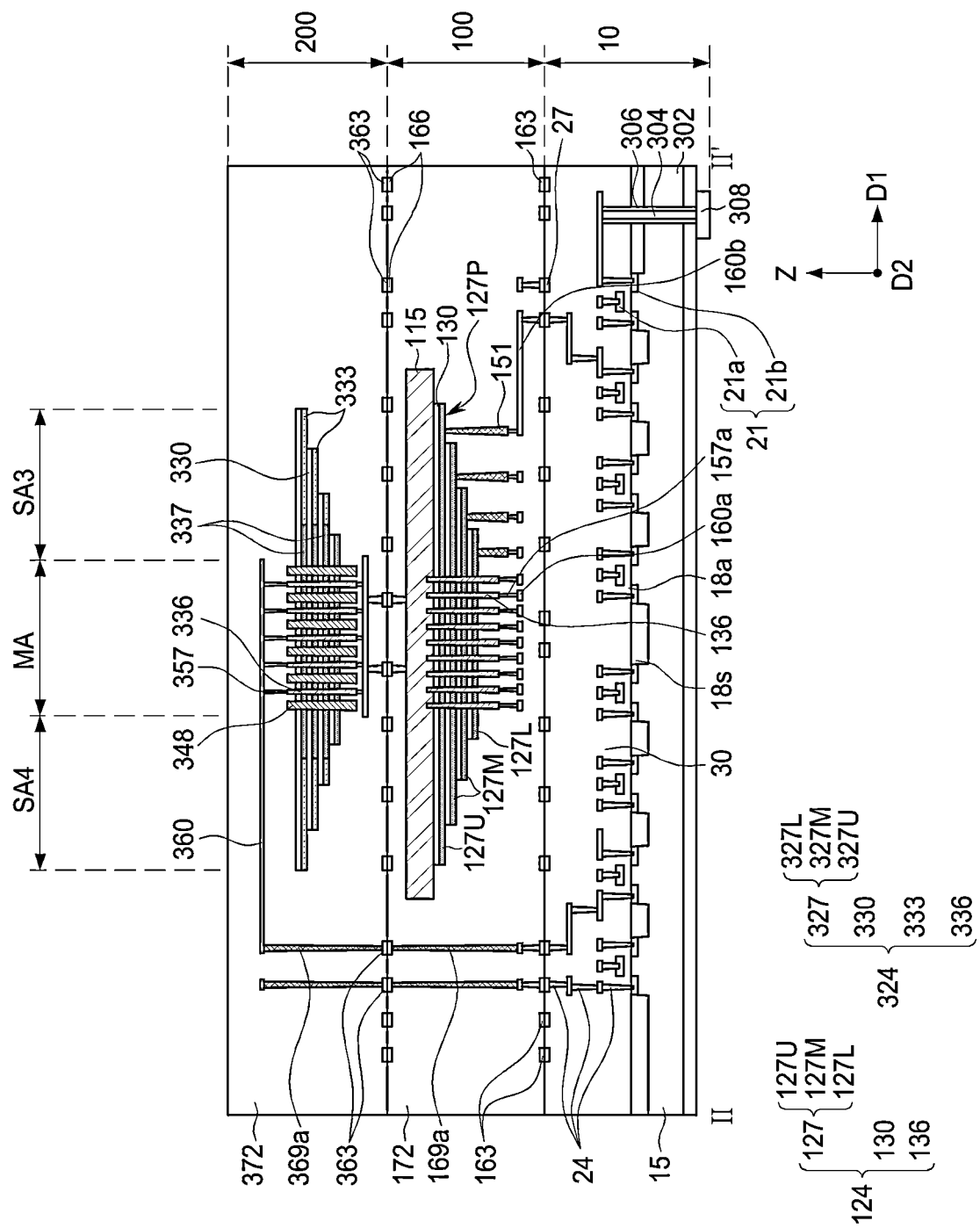
FIG. 7 is a cross-sectional view illustrating a modified example of a semiconductor device according to an example embodiment.

Next, a modified example of the input/output pad 274 of FIG. 5B will be described with reference to FIG. 7. FIG. 7 is a cross-sectional view illustrating a region taken along line II-II' of FIG. 1 to illustrate a modified example of the semiconductor device according to an example embodiment.

In the modified example, referring to FIG. 7, the input/output pad (274 of FIG. 5B) may be replaced with an input/output pad 308 disposed below the lower chip structure 10. Accordingly, the lower chip structure 10 may further include a rear insulating layer 302 in contact with a lower surface of the semiconductor substrate 15, an input/output through-electrode 304 penetrating through the semiconductor substrate 15 and the rear insulating layer 302 to be in contact with a portion of the interconnections 24, and an insulating spacer 306 covering a side surface of the input/output thorough-electrode 304.

Next, various arrangement forms of a decoder circuit, a page buffer, and a logic circuit of the peripheral circuit 8 in the lower chip structure 10 described above in FIG. 1 will be described with reference to FIG. 8.

In FIG. 1, the first peripheral circuit (8a of FIG. 1) is illustrated as having a structure in which the first logic circuit 4a is disposed between the first decoder circuit 2a and the first page buffer 6a, but example embodiments are not limited thereto. For example, as illustrated in FIG. 8, a peripheral circuit 8' may include a first peripheral circuit 8a' and a second peripheral circuit 8b', the first peripheral circuit 8a' may include a first logic circuit 4a1, and a first decoder circuit 2a1 and a first page buffer 6a1 surrounding the first logic circuit 4a1, and the second peripheral circuit 8b' may include a second logic circuit 4b1, and a second decoder circuit 2b1 and a second page buffer 6b1 surrounding the second logic circuit 4b1.

The first decoder circuit 2a1 may include a first sub-decoder 2a_1a for controlling first gate lines 127 in the first region 101A and a second sub-decoder 2a_2a for controlling second gate lines 227 in the third region 201A, and the second decoder circuit 2b1 may include a third sub-decoder 2a_1b controlling first gate lines 127 in the second region 101B and a fourth sub-decoder 2a_2b controlling second gate lines 227 in the fourth region 127. The first sub-decoder 2a_1a and the second sub-decoder 2a_2a may be adjacent to each other. The third sub-decoder 2a_1b and the fourth sub-decoder 2a_2b may be adjacent to each other.

The first page buffer 6a1 may include a first sub-page buffer 6a_1a for controlling first bit lines 160a in the first region 101A and a second sub-page buffer 6a_2a for controlling second bit lines 260a in the third region 201A, and the second page buffer 61b may include a third sub-page buffer 6a_1b for controlling first bit lines 160a in the second region 101B and a fourth page buffer 6a_2b for controlling second bit lines 260a in the fourth region 201B. The first sub-page buffer 6a_1a and the second sub-page buffer 6a_2a may be adjacent to each other, and the third sub-page buffer 6a_1b and the fourth sub-page buffer 6a_2b may be adjacent to each other.

Figure 9:
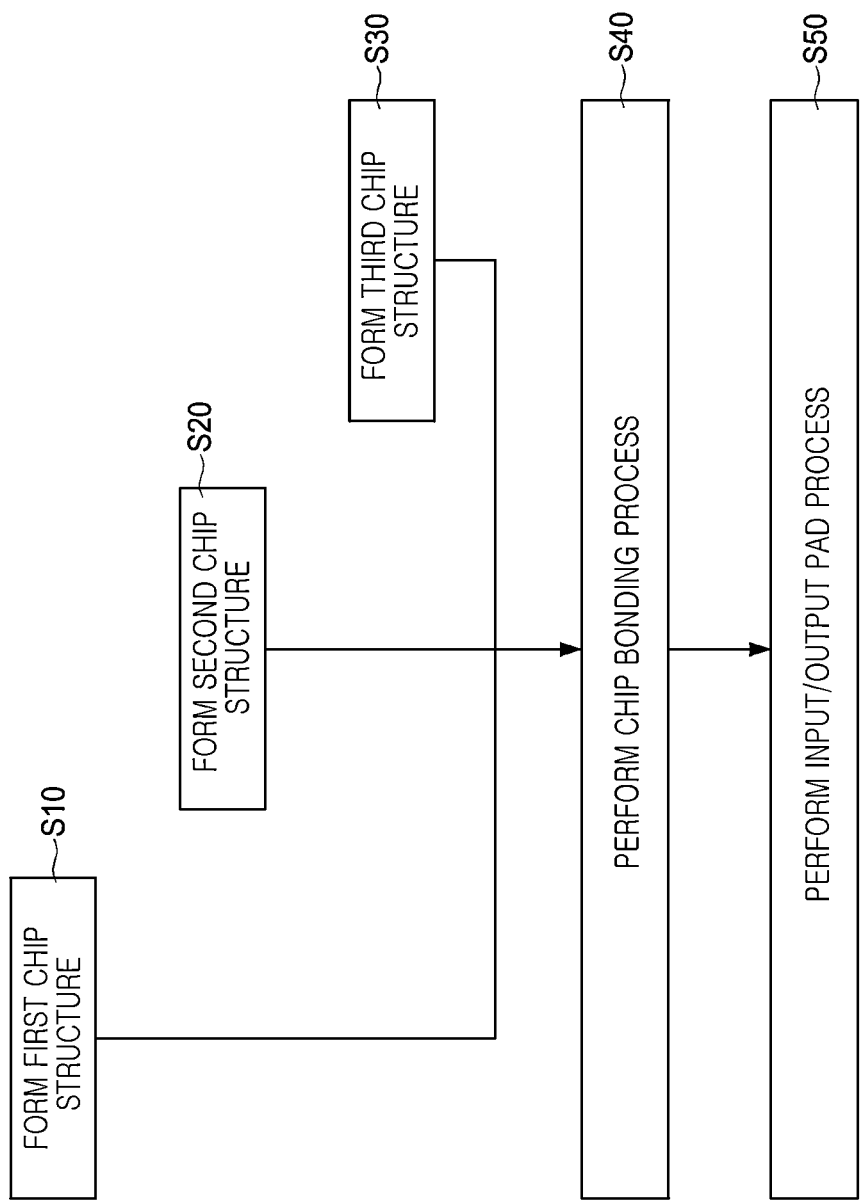
FIG. 9 is a process flowchart illustrating an example of a method of fabricating a semiconductor device according to an example embodiment.

Next, an example of a method of fabricating a semiconductor device according to an example embodiment will be described with reference to FIG. 9. FIG. 9 is a process flowchart illustrating an example of a method of fabricating a semiconductor device according to an example embodiment.

Referring to FIG. 9, a first chip structure may be formed (S10). A second chip structure may be formed (S20). A third chip structure may be formed (S30). The first chip structure, the second chip structure, and the third chip structure may be formed using separate semiconductor wafers, respectively.

The first chip structure may be configured as a first semiconductor wafer including substantially the same lower chip structure 10 as described in FIG. 1. The second chip structure may be configured as a second semiconductor wafer including substantially the same first memory chip structure 100 as described in FIG. 1. The second chip structure may be configured as a second semiconductor wafer including substantially the same second memory chip structure 200 as described in FIG. 1.

A wafer bonding process may be performed (S40). An input/output pad process may be performed (S50).

As an example, the wafer bonding process may include bonding the second semiconductor wafer and the third semiconductor wafer to each other and then bonding the second semiconductor wafer and the first semiconductor wafer to each other. As another example, the wafer bonding process may include bonding the first semiconductor wafer and the second semiconductor wafer to each other and then bonding the second semiconductor wafer and the third semiconductor wafer to each other.

As an example, the process of bonding the first semiconductor wafer and the second semiconductor wafer to each other may include bonding a lower bonding structure (27 of FIGS. 2A and 2B) of the first semiconductor wafer and a first intermediate bonding pad structure (163 of FIGS. 2A and 2B) of the second semiconductor wafer to each other, removing a semiconductor substrate portion of the second semiconductor wafer, and forming a second intermediate bonding pad structure (166 of FIGS. 2A and 2B) on the second semiconductor wafer from which the semiconductor substrate is removed.

As an example, the process of bonding the second semiconductor wafer and the third semiconductor wafer to each other may include removing a semiconductor substrate (e.g., a semiconductor substrate portion) of the third semiconductor wafer to form an upper bonding pad structure (263 of FIGS. 2A and 2B) on the third semiconductor wafer, from which the semiconductor substrate is removed, and bonding the upper bonding pad structure (263 of FIGS. 2A and 2B) of the third semiconductor wafer and a second intermediate bonding pad structure (166 of FIGS. 2A and 2B) of the second semiconductor wafer to each other.

As another example, the process of bonding the second semiconductor wafer and the third semiconductor wafer to each other may include forming an upper bonding pad structure (363 of FIGS. 5A and 5B) on the third semiconductor wafer, bonding the upper bonding pad structure (363 of FIGS. 5A and 5B) of the third semiconductor wafer and a second intermediate bonding pad structure (166 of FIGS. 2A and 2B) of the second semiconductor wafer to each other, removing a semiconductor substrate (e.g., a semiconductor substrate portion) of the third semiconductor wafer and sequentially forming bit line studs (357 of FIGS. 5A and 5B) and second bit lines (360 of FIGS. 5A and 5B), and forming an insulating layer to cover the second bit lines (360 of FIGS. 5A and 5B).

Figure 10:
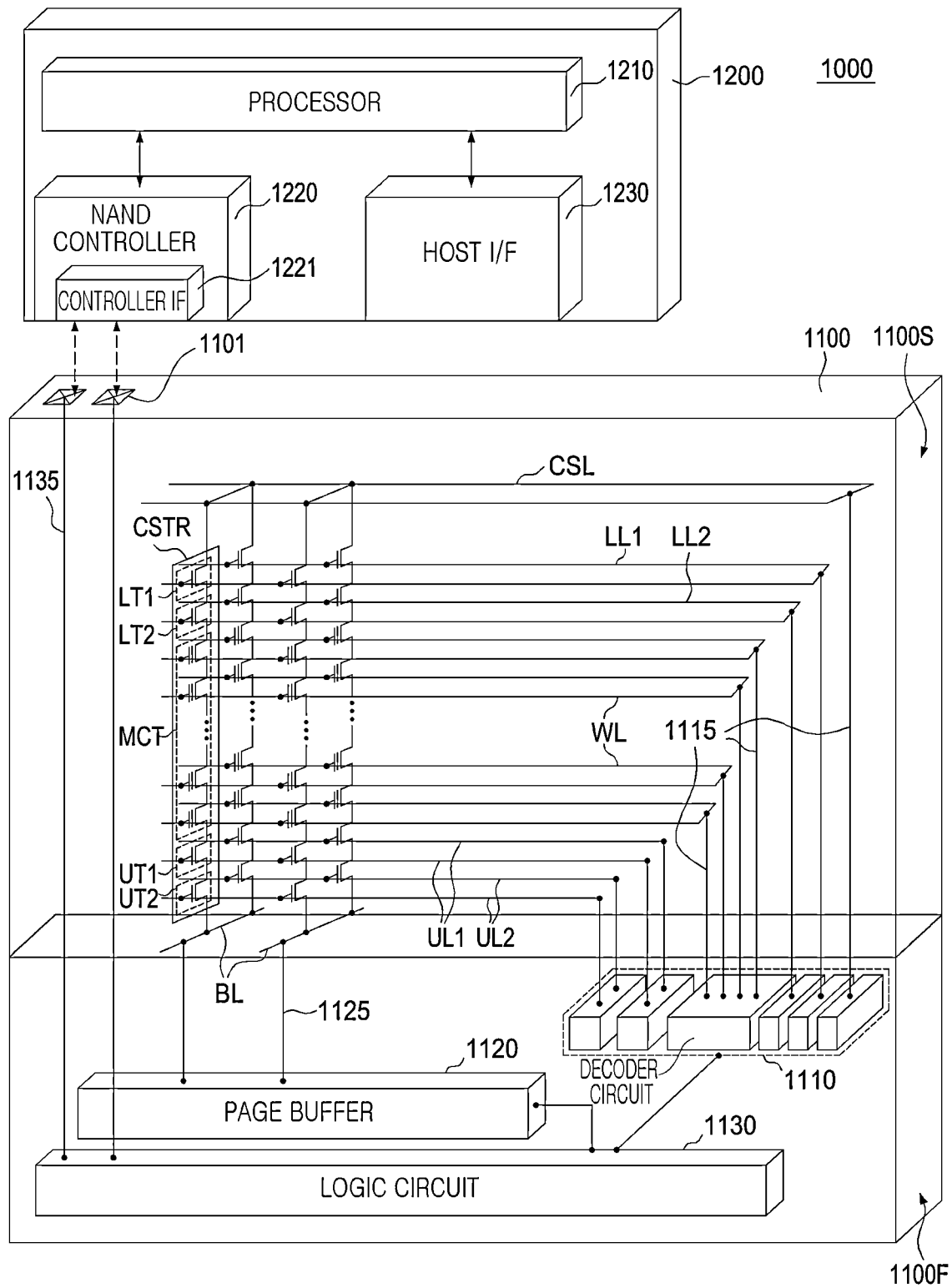
FIG. 10 is a schematic view of a data storage system including a semiconductor device according to an example embodiment.

FIG. 10 is a schematic view of a data storage system including a semiconductor device according to an example embodiment.

Referring to FIG. 10, a data storage system 1000 according to an example embodiment may include a semiconductor device 1100 and a controller 1200 electrically connected to the semiconductor device 1100. The data storage system 1000 may be implemented as a storage device including the semiconductor device 1100 or an electronic device including a storage device. For example, the data storage system 1000 may be implemented by a solid state drive device (SSD), a universal serial bus (USB), a computing system, a medical device, or a communication device, which may include the semiconductor device 1100.

In an example embodiment, the data storage system 1000 may be configured as an electronic system storing data.

The semiconductor device 1100 may be implemented by a semiconductor device described in one of the aforementioned example embodiments with reference to FIGS. 1 to 8. The semiconductor device 1100 may include a first structure 1100F and a second structure 1100S on the first structure 1100F.

The first structure 1100F may be a peripheral circuit structure including a decoder circuit 1110, a page buffer 1120, and a logic circuit 1130. For example, the first structure 1100F may be the above-described lower chip structure 10 including the peripheral circuit (8 in FIG. 1 or 8' in FIG. 8).

Figure 8:
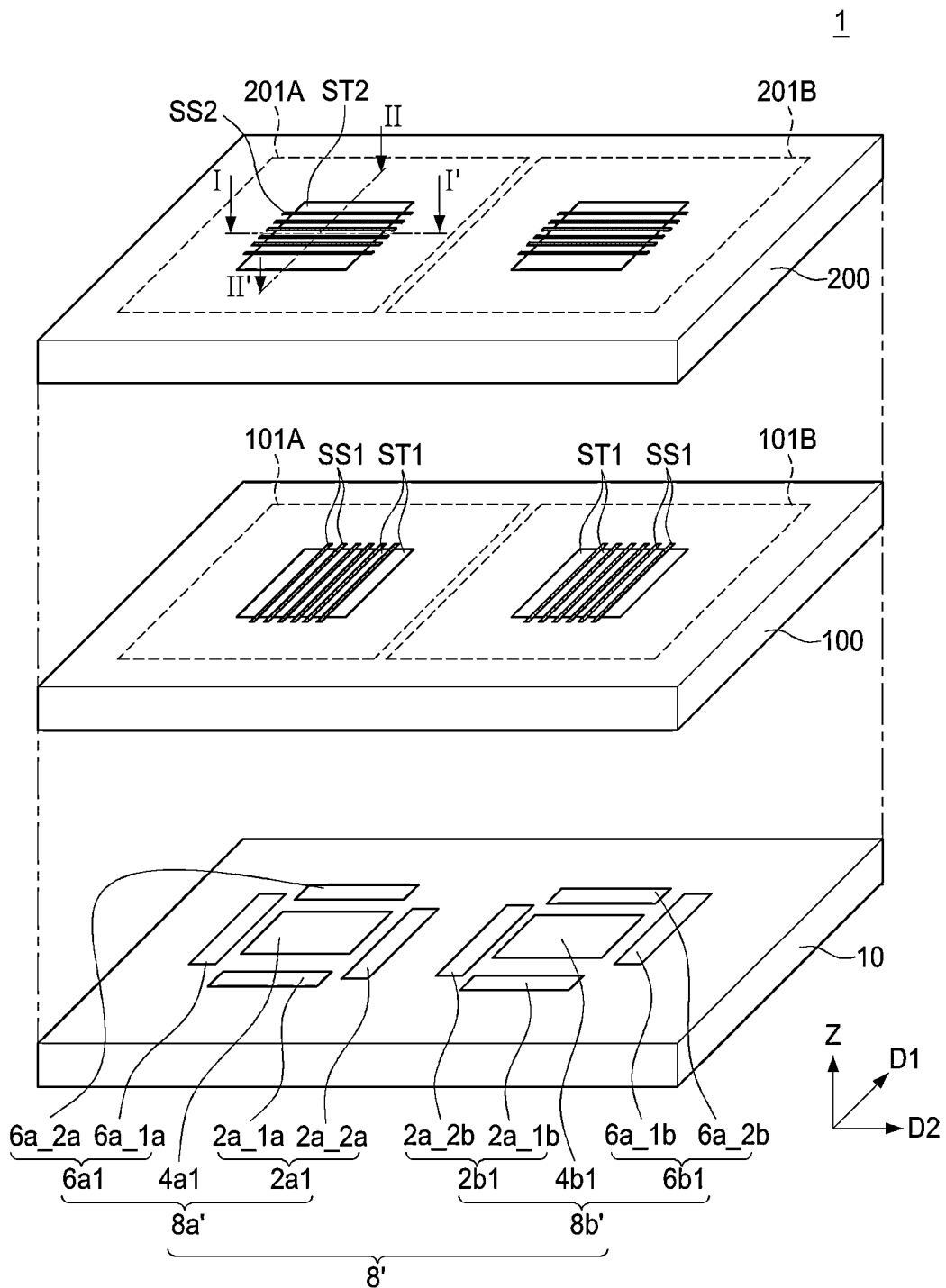
FIG. 8 is a schematic perspective view illustrating a modified example of a semiconductor device according to an example embodiment.

The decoder circuit 1110 may be the decoder circuit described in FIGS. 1 (2*a* and 2*b* of FIGS. 1 or 2*a*1 and 2*b*1 of FIG. 8), the page buffer 1120 may be the page buffer described in FIGS. 1 (6*a* and 6*b* of FIGS. 1 or 6*a*1 and 6*b*1 of FIG. 8), and the logic circuit 1130 described in FIGS. 1 (4*a* and 4*b* of FIGS. 1 or 4*a*1 and 4*b*1 of FIG. 8).

The second structure 1100S may be a memory cell structure includes a bit line BL, a common source line CSL, word lines WL, first and second upper gate lines UL1 and UL2, first and second lower gate lines LL1 and LL2, and memory cell strings CSTR between the bit line BL and the common source line CSL.

The first and second common source patterns 115 and 215 of the first and second memory chip structures 100 and 200 may correspond to the common source line CSL of the second structure 1100S, the one or more lower select gate lines 127L and 227L of the first and second memory chip structures 100 and 200 may correspond to the first and second upper gate lines UL1 and UL2 of the second structure 1100S, the first and second word lines 127M and 227M of the first and second memory chip structures 100 and 200 may correspond to the word lines WL of the second structure 1100S, and the one or more upper select gate lines 127U and 227U of the first and second memory chip structures 100 and 200 may correspond to the first and second lower gate lines L1 and LL2 of the second structure 1100S.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may vary according to example embodiments.

In some example embodiments, the upper transistors UT1 and UT2 may include a string select transistor, and the lower transistors LT1 and LT2 may include a ground select transistor. The gate lower lines LL1 and LL2 may be gate electrodes of lower the transistors LT1 and LT2, respectively. The word lines WL may be gate electrodes of memory cell transistors MCT, and the upper gate lines UL1 and UL2 may be gate electrodes of upper transistors UT1 and UT2, respectively.

In some example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 or the upper erase control transistor UT1 may be used in an erase operation to erase data stored in the memory cell transistors MCT using gate induced drain leakage (GIDL) current.

The common source line CSL, the first and second gate lower lines LL1 and LL2, the word lines WL, and the first and second upper gate lines UL1 and UL2 may be electrically connected to the decoder circuit 1110 through first interconnections 1115 extending from the first structure 1100F to the second structure 1100S.

The bit lines BL may be electrically connected to the page buffer 1120 through second interconnections 1125 extending from the first structure 1100F to the second structure 1100S. The bit lines BL may be the above-described first and second bit lines 160a and 260a.

In the first structure 1100F, the decoder circuit 1110 and the page buffer 1120 may perform a control operation on at least one select memory cell transistor, among the plurality of memory cell transistors MCT. The decoder circuit 1110 and the page buffer 1120 may be controlled by a logic circuit 1130. The semiconductor device 1100 may communicate with the controller 1200 through the input/output pad 1101 electrically connected to the logic circuit 1130. The input/output pad 1101 may be electrically connected to the logic circuit 1130 through an input/output connection wiring 1135 extending from the first structure 1100F to the second structure 1100S.

The controller 1200 may include a processor 1210, a NAND controller 1220, and a host interface 1230. In some example embodiments, the data storage system 1000 may include a plurality of semiconductor devices 1100. In this case, the controller 1200 may control the plurality of semiconductor devices 1000.

The processor 1210 may control an overall operation of the data storage system 1000 including the controller 1200. The processor 1210 may operate based on predetermined firmware, and may control the NAND controller 1220 to access the semiconductor device 1100. The NAND controller 1220 may include a NAND interface 1221 for processing communication with the semiconductor device 1100. A control command for controlling the semiconductor device 1100, data to be written in the memory cell transistors MCT of the semiconductor device 1100, data to be read from the memory cell transistors MCT of the semiconductor device 1100, and the like, may be transmitted through the NAND interface 1221. The host interface 1230 may provide a communications function between the data storage system 1000 and an external host. When a control command is received from an external host through the host interface 1230, the processor 1210 may control the semiconductor device 1100 in response to the control command.

Figure 11:
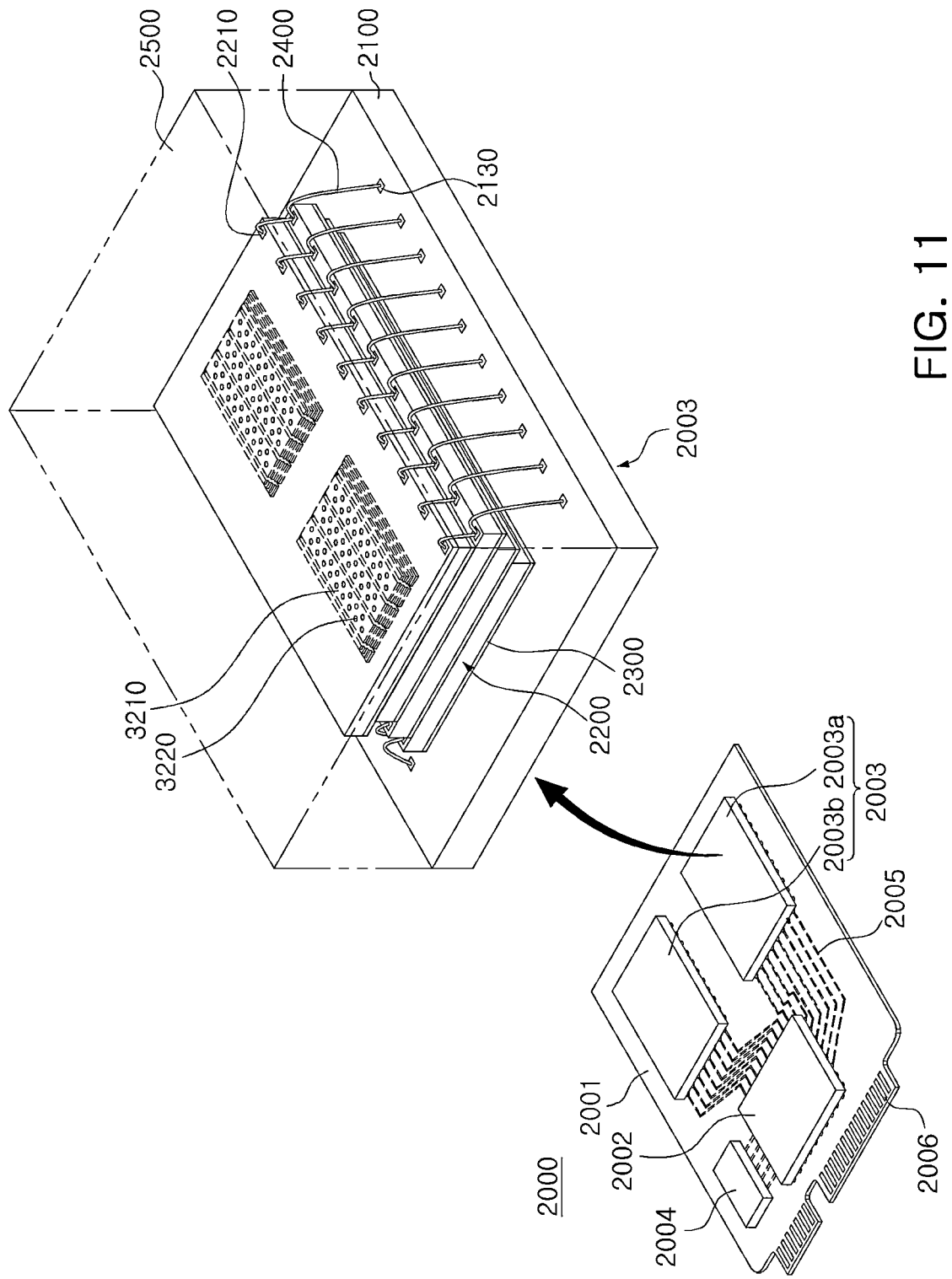
FIG. 11 is a schematic perspective view of a data storage system including a semiconductor device according to an example embodiment.

FIG. 11 is a schematic perspective view of a data storage system including a semiconductor device according to an example embodiment.

Referring to FIG. 11, a data storage system 2000 according to an example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number and arrangement of the plurality of pins in the connector 2006 may vary depending on a communications interface between the data storage system 2000 and the external host. In some example embodiments, the data storage system 2000 may communicate with the external host using an interface, among interfaces such as universal serial bus (USB), peripheral component interconnect express (PCI-Express), serial advanced technology attachment (SATA), and M-PHY for universal flash storage (UFS). In some example embodiments, the data storage system 2000 may operate with power supplied from an external host through the connector 2006. The data storage system 2000 may further include a power management integrated circuit (PMIC) for distributing power supplied from the external host to the controller 2002 and the semiconductor package 2003.

The controller 2002 may write data in the semiconductor package 2003 or may read data from the semiconductor package 2003, and may increase an operating speed of the data storage system 2000.

The DRAM 2004 may be configured as a buffer memory for mitigating a difference in speed between the semiconductor package 2003, a data storage space, and an external host. The DRAM 2004 included in the data storage system 2000 may also operate as a cache memory, and may provide a space for temporarily storing data in a control operation on the semiconductor package 2003. When the DRAM 2004 is included in the data storage system 2000, the controller 2002 further may include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of the semiconductor chips 2200. Each of the semiconductor chips 2200 may include a semiconductor device according to one of the example embodiments described with reference to FIGS. 1 to 8.

Each of the first and second semiconductor packages 2003a and 2003b may include the package substrate 2100, the semiconductor chips 2200 on the package substrate 2100, adhesive layers 2300 respectively disposed on lower surfaces of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including package upper pads 2130. Each of the semiconductor chips 2200 may include an input/output pad 2210.

The input/output pad 2210 may be configured as the input/output pad 274 of FIG. 2B or the input/output pad 308 of FIG. 3.

In some example embodiments, the connection structure 2400 may be configured as a bonding wire electrically connecting the input/output pad 2210 to the package upper pads 2130. Accordingly, in each of the first and second semiconductor packages 2003a and 2003b, the semiconductor chips 2200 may be electrically connected to each other in a wire bonding manner, and may be electrically connected to the package upper pads 2130 of the package substrate 2100. In some example embodiments, in each of the first and second semiconductor packages 2003a and 2003b, the semiconductor chips 2200 may be electrically connected to each other through a connection structure including a through-silicon via (TSV), rather than the connection structure 2400 of the wire bonding manner.

In some example embodiments, the controller 2002 and the semiconductor chips 2200 may be included in a single package. For example, the controller 2002 and the semiconductor chips 2200 may be mounted on an interposer substrate different from the main substrate 2001, and the controller 2002 and the semiconductor chips 2200 may be connected to each other by wirings formed on the interposer substrate.

Any functional blocks shown in the figures and described above may be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

As described above, a semiconductor device for improving integration density and reliability and a data storage system including the same may be provided. A semiconductor device according to some example embodiments may include a first memory chip structure, including first gate lines extending in a first horizontal direction, and a second memory chip structure including second gate lines extending in a second horizontal direction, perpendicular to the first horizontal direction. Because the semiconductor device may include the first memory chip structure and the second memory chip structure, the total number of gates may be increased. Accordingly, the integration density of the semiconductor device may be improved. Because the first direction, in which the first gate lines of the first memory chip structure extend, and the second direction, in which the second gate lines of the second memory chip structure extend, are perpendicular to each other, deformation such as warpage of the semiconductor device may be significantly reduced. Accordingly, reliability of the semiconductor device may be improved.

While some example embodiments have been shown and described above, it will be apparent to those skilled in the art that modifications and variations could be made without departing from the scope of the present inventive concepts as defined by the appended claims.

What is claimed is:

1. A semiconductor device comprising:
a lower chip structure including a peripheral circuit;
a first memory chip structure on the lower chip structure; and
a second memory chip structure on the first memory chip structure,
wherein the first memory chip structure includes a first stack structure and a first vertical memory structure,
wherein the first stack structure includes first gate lines stacked in a vertical direction and extending in a first horizontal direction, the first horizontal direction being perpendicular to the vertical direction,
wherein the first vertical memory structure penetrates through the first gate lines of the first stack structure in the vertical direction,
wherein the second memory chip structure includes a second stack structure and a second vertical memory structure,
wherein the second stack structure includes second gate lines stacked in the vertical direction and extending in a second horizontal direction, the second horizontal direction being perpendicular to the first horizontal direction, and
wherein the second vertical memory structure penetrates through the second gate lines of the second stack structure in the vertical direction.

2. The semiconductor device of claim 1, wherein
the lower chip structure further includes a semiconductor substrate, interconnections and a lower bonding pad structure, and
the peripheral circuit is on the semiconductor substrate,
the interconnections are on the peripheral circuit and are electrically connected to the peripheral circuit,
the lower bonding pad structure is on the interconnections and is electrically connected to the interconnections,
the first memory chip structure further includes a first intermediate bonding pad structure that is below the first stack structure and directly bonded to the lower bonding pad structure, and a second intermediate bonding pad structure on the first stack structure, and
the second memory chip structure includes an upper bonding pad structure that is below the second stack structure and directly bonded to the second intermediate bonding pad structure.

3. The semiconductor device of claim 2, wherein each of the lower bonding pad structure, the first intermediate bonding pad structure, the second intermediate bonding pad structure, and the upper bonding pad structure includes a copper material.

4. The semiconductor device of claim 1, wherein
the first memory chip structure further includes a first bit line,
the first bit line is below the first gate lines and electrically connected to the first vertical memory structure, and
the first bit line extends in the second horizontal direction.

5. The semiconductor device of claim 4, wherein
the second memory chip structure further includes a second bit line,
the second bit line is on the second gate lines and electrically connected to the second vertical memory structure, and
the second bit line extends in the first horizontal direction.

6. The semiconductor device of claim 1, wherein
the first memory chip structure further includes a first common source pattern,
the first gate lines is below the first common source pattern, and
the first common source pattern is electrically connected to the first vertical memory structure.

7. The semiconductor device of claim 6, wherein
the second memory chip structure further includes a second common source pattern, and
the second common source pattern is below the second gate lines and is electrically connected to the second vertical memory structure.

8. The semiconductor device of claim 1, wherein the first memory chip structure further includes:
first gate contact plugs below the first gate lines; and
first gate interconnection lines on a lower level than the first gate contact plugs and electrically connected to the first gate contact plugs.

9. The semiconductor device of claim 1, wherein the second memory chip structure further includes:
second gate contact plugs on the second gate lines; and
second gate interconnection lines at a higher level than the second gate contact plugs and electrically connected to the second gate contact plugs.

10. The semiconductor device of claim 1, wherein the second memory chip structure further comprises:
second gate contact plugs below the second gate lines; and
second gate interconnections at a lower level than the second gate contact plugs and electrically connected to the second gate contact plugs.

11. The semiconductor device of claim 1, wherein
the first stack structure has a first stack region, a first staircase region at a first side of the first stack region, and a second staircase region at a second side of the first stack region, the first gate lines are spaced apart from each other and stacked in the first stack region in the vertical direction, and extend to the first staircase region from the first stack region to be in a staircase form in the first staircase region, the second stack structure has a second stack region, a third staircase region at a third side of the second stack region, and a fourth staircase region at a fourth side of the second stack region, the second gate lines are spaced apart from each other and stacked in the vertical direction in the second stack region, and extend to the third staircase region from the second stack region to be in a staircase form in the third staircase region, and the second stack region overlaps the first stack region in the vertical direction.

12. The semiconductor device of claim 11, wherein
the first stack structure further includes first dummy insulating patterns in the second staircase region,
the second stack structure further includes second dummy insulating patterns in the fourth staircase region,
at least some of the first gate lines are at a same level as the first dummy insulating patterns,
at least some of the second gate lines are at a same level as the second dummy insulating patterns,
the first staircase region of the first stack structure overlaps the third staircase region of the second stack structure in the vertical direction, and
the second staircase region of the first stack structure overlaps the fourth staircase region of the second stack structure in the vertical direction.

13. The semiconductor device of claim 1, wherein
the first memory chip structure further includes first separation structures penetrating through the first stack structure and intersecting the first stack structure,
the second memory chip structure further includes second separation structures penetrating through the second stack structure and intersecting the second stack structure,
the first gate lines are between the first separation structures,
the second gate lines are between the second separation structures,
each of the first separation structures extends in the first horizontal direction, and
each of the second separation structures extends in the second horizontal direction.

14. A semiconductor device comprising:
a first memory chip structure including first word lines spaced apart from each other and stacked in a vertical direction and a first vertical memory structure penetrating through the first word lines in the vertical direction; and
a second memory chip structure including second word lines spaced apart from each other and stacked in the vertical direction and a second vertical memory structure penetrating through the second word lines in the vertical direction,
wherein the first word lines extend in a first horizontal direction perpendicular to the vertical direction,
wherein the second word lines extend in a second horizontal direction perpendicular to the vertical direction and the first horizontal direction, and
wherein the second memory chip structure is in contact with the first memory chip structure.

15. The semiconductor device of claim 14, wherein
the first memory chip structure further includes first intermediate bonding pads at a higher level than the first word lines,
the second memory chip structure further includes second intermediate bonding pads at a lower level than the second word lines, and
the second intermediate bonding pads are in direct contact with the first intermediate bonding pads.

16. The semiconductor device of claim 14, wherein
at least one of the first memory chip structure or the second memory chip structure further includes a common source pattern, and
the common source pattern is at a higher level than the first word lines and at a lower level than the second word lines.

17. The semiconductor device of claim 14, wherein
the first memory chip structure further includes a first bit line electrically connected to the first vertical memory structure and extending in the second horizontal direction, and
the second memory chip structure further includes a second bit line electrically connected to the second vertical memory structure and extending in the first horizontal direction.

18. A data storage system comprising:
a main substrate;
a semiconductor device on the main substrate; and
a controller electrically connected to the semiconductor device on the main substrate,
wherein the semiconductor device comprises,
a first memory chip structure including first word lines spaced apart from each other and stacked in a vertical direction and a first vertical memory structure penetrating through the first word lines in the vertical direction; and
a second memory chip structure including second word lines spaced apart from each other and stacked in the vertical direction and second vertical memory structures penetrating through the second word lines in the vertical direction,
wherein the first word lines extend in a first horizontal direction perpendicular to the vertical direction,
wherein the second word lines extend in a second horizontal direction perpendicular to the vertical direction and the first horizontal direction, and
wherein the second memory chip structure is in contact with the first memory chip structure.

19. The data storage system of claim 18, wherein
the first memory chip structure further includes first intermediate bonding pads at a higher level than the first word lines,
the second memory chip structure further includes second intermediate bonding pads at a lower level than the second word lines, and
the second intermediate bonding pads are in contact with the first intermediate bonding pads.

20. The data storage system of claim 18, wherein
the first memory chip structure further includes a first bit line electrically connected to the first vertical memory structure and extending in the second horizontal direction, and
the second memory chip structure further includes a second bit line electrically connected to a corresponding one of the second vertical memory structures and extending in the first horizontal direction.

* * * * *